(12) United States Patent
Matsumoto

(10) Patent No.: US 11,081,550 B2
(45) Date of Patent: Aug. 3, 2021

(54) TUNNEL FIELD-EFFECT TRANSISTOR HAVING A STACKED STRUCTURE INCLUDING A FIRST ACTIVE REGION AND A SECOND ACTIVE REGION

(71) Applicant: SONY SEMICONDUCTOR SOLUTIONS CORPORATION, Kanagawa (JP)

(72) Inventor: Koichi Matsumoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 109 days.

(21) Appl. No.: 16/466,153

(22) PCT Filed: Nov. 17, 2017

(86) PCT No.: PCT/JP2017/041446
§ 371 (c)(1),
(2) Date: Jun. 3, 2019

(87) PCT Pub. No.: WO2018/110202
PCT Pub. Date: Jun. 21, 2018

(65) Prior Publication Data
US 2020/0066844 A1    Feb. 27, 2020

(30) Foreign Application Priority Data

Dec. 13, 2016  (JP) .............................. JP2016-241102

(51) Int. Cl.
| H01L 29/16 | (2006.01) |
| H01L 29/76 | (2006.01) |
| H01L 29/78 | (2006.01) |

(52) U.S. Cl.
CPC ...... *H01L 29/1606* (2013.01); *H01L 29/7606* (2013.01); *H01L 29/78* (2013.01)

(58) Field of Classification Search
CPC ................................................... H01L 29/1606
See application file for complete search history.

(56) References Cited

U.S. PATENT DOCUMENTS

| 5,414,274 A | 5/1995 | Goronkin et al. |
| 5,608,231 A | 3/1997 | Ugajin et al. |
| (Continued) | | |

FOREIGN PATENT DOCUMENTS

| JP | H07-078962 | 3/1995 |
| JP | H07-176763 | 7/1995 |
| (Continued) | | |

OTHER PUBLICATIONS

Cao et al., "A computational study of van der Waals tunnel transistors: fundamental aspects and design challenges," IEEE, 2015, 4 pages.

(Continued)

*Primary Examiner* — Thao X Le
*Assistant Examiner* — Laura M Dykes
(74) *Attorney, Agent, or Firm* — Sheridan Ross P.C.

(57) ABSTRACT

A tunnel field-effect transistor has a stacked structure including a second active region, a first active region, and a control electrode. The first active region includes a first-A active region and a first-B active region between the first-A active region and a first active region extension portion. A second active region exists below the first-A active region, and the second active region does not exist below the first-B active region. Where an orthographic projection image of the second active region and an orthographic projection image of the first active region overlap with each other is defined as $L_{2\text{-}Total}$, and a length in a Y direction of the first active region is defined as $L_{1\text{-}Y}$, when an axial direction of the first (Continued)

active region is defined as an X direction, and a stacked direction of the stacked structure is defined as a Z direction, $L_{1-Y} < L_{2-Total}$ is satisfied.

20 Claims, 17 Drawing Sheets

(56) References Cited

U.S. PATENT DOCUMENTS

| | | | |
|---|---|---|---|
| 6,653,687 B1* | 11/2003 | Yamazaki | B82Y 10/00 257/345 |
| 2009/0051384 A1 | 2/2009 | Katayama | |
| 2013/0064005 A1 | 3/2013 | Heyns et al. | |
| 2014/0097403 A1* | 4/2014 | Heo | H01L 29/78681 257/27 |
| 2015/0171167 A1 | 6/2015 | Nourbakhsh et al. | |
| 2016/0043234 A1* | 2/2016 | Alper | H01L 29/0676 327/537 |
| 2016/0284858 A1* | 9/2016 | Yamazaki | H01L 29/42392 |
| 2016/0300908 A1* | 10/2016 | Heo | H01L 29/42384 |

FOREIGN PATENT DOCUMENTS

| | | |
|---|---|---|
| JP | H08-181309 | 7/1996 |
| JP | 2013-080906 | 5/2013 |
| JP | 2015-090984 | 5/2015 |
| JP | 2015-119178 | 6/2015 |
| WO | WO 2005/117127 | 12/2005 |

OTHER PUBLICATIONS

International Search Report prepared by the Japan Patent Office dated Jan. 24, 2018, for International Application No. PCT/JP2017/041446.

* cited by examiner

TUNNEL FIELD-EFFECT TRANSISTOR HAVING A STACKED STRUCTURE INCLUDING A FIRST ACTIVE REGION AND A SECOND ACTIVE REGION

CROSS REFERENCE TO RELATED APPLICATIONS

This application is a national stage application under 35 U.S.C. 371 and claims the benefit of PCT Application No. PCT/JP2017/041446 having an international filing date of 17 Nov. 2017, which designated the United States, which PCT application claimed the benefit of Japanese Patent Application No. 2016-241102 filed 13 Dec. 2016, the entire disclosures of each of which are incorporated herein by reference.

TECHNICAL FIELD

The present disclosure relates to a tunnel field-effect transistor.

BACKGROUND ART

As a low power consumption device, a tunnel field-effect transistor (TFET) can be exemplified as one of candidates of a next generation device. Here, a two-dimensional material (2D material) such as transition metal dichalcogenides (TMDC) is focused in development of the TFET. Additionally, such a TFET is known from Japanese Patent Application Laid-Open No. 2015-090984, for example. A semiconductor element disclosed in this patent publication has, as described in the paragraph number [0131] with reference to FIG. 14, for example, a stacked structure including:

a first conductive layer CL10 functioning as a drain electrode;

a semiconductor layer SL10 including a two-dimensional material element and functioning as a tunneling layer;

a second conductive layer CL20 functioning as a source electrode;

an insulation layer NL10 functioning as a gate insulation layer; and a third conductive layer CL30 functioning as a gate electrode. Hereinafter, such a stacked structure may be referred to as a "stacked structure disclosed in a stacked structure Japanese Patent Application Laid-Open No. 2015-090984".

CITATION LIST

Patent Document

Patent Document 1: Japanese Patent Application Laid-Open No. 2015-090984

NON-PATENT DOCUMENT

Non-Patent Document 1: A computational study of van der Waals tunnel transistors: fundamental aspects and design challenges", Jiang Cao et al., IEDM15-313 12.5.1-12.5.4

SUMMARY OF THE INVENTION

Problems to be Solved by the Invention

By the way, in a structure described above, a second conductive layer CL20 functioning as a source electrode and a third conductive layer CL30 functioning as a gate electrode face each other via an insulation layer NL10 functioning as a gate insulation layer. Therefore, capacitance formed by the second conductive layer CL20, the insulation layer NL10, and the third conductive layer CL30 is larger than capacitance of a MOS type FET in the related art, and there is a problem that power consumption is increased.

Accordingly, the present disclosure is directed to providing a tunnel field-effect transistor having a configuration and a structure capable of suppressing an increase in power consumption.

Solutions to Problems

A tunnel field-effect transistor according to a first aspect of the present disclosure to achieve the above-described object includes:

a first active region;

a second active region provided under the first active region;

a control electrode provided on the first active region;

a first active region extension portion extending from the first active region; and a second active region extension portion extending from the second active region, in which the first active region includes a first-A active region and a first-B active region located at least between the first-A active region and the first active region extension portion, an orthographic projection image of the control electrode and an orthographic projection image of the first active region at least partly overlap with each other, the second active region exists below the first-A active region, the second active region does not exist below the first-B active region, and $L_{1-Y} < L_{2-Total}$ is satisfied in a case where:

a total extension length of an end portion of a portion of the second active region where an orthographic projection image of the second active region overlaps with the orthographic projection image of the first active region is defined as $L_{2-Total}$; and a length in a Y direction of the first active region overlapping with the orthographic projection image of the second active region is defined as $L_{1-Y}$ when a direction extending from the first active region to the first active region extension portion is defined as an X direction and a stacked direction of the second active region, the first active region, and the control electrode is defined as a Z direction.

A tunnel field-effect transistor according to a second aspect of the present disclosure to achieve the above-described object includes:

a first active region;

a second active region provided under the first active region;

a control electrode provided on the first active region;

a first active region extension portion extending from the first active region; and a second active region extension portion extending from the second active region, in which when a portion of the first active region where an orthographic projection image of the control electrode, an orthographic projection image of the first active region, and an orthographic projection image of the second active region overlap with one another is defined as a first-a active region, a portion of the first active region where the orthographic projection image of the control electrode and the orthographic projection image of the first active region overlap with each other and do not overlap with the orthographic projection image of the second active region is defined as a first-b active region, the first-b active region has a characteristic as a first conductivity type, and the second active region has a characteristic as a second conductivity type different from the first conductivity type, an insulation region is formed under the first-b active region and under the first active region extension portion, and the first-a active region includes a first-$a_1$ active region and a first-$a_2$ active region interposed between the first-$a_1$ active region and the first-b active region, having the characteristic as the first conductivity type, and having an impurity concentration higher than an impurity concentration of the first-$a_1$ active region.

Effects of the Invention

In the tunnel field-effect transistor according to the first aspect of the present disclosure, since the control electrode, the first-A active region, and the second active region overlap with one another, reliable operation of the tunnel field-effect transistor can be assured. Note that a region where the orthographic projection image of the first-A active region and the orthographic projection image of the second active region coincide and overlap with each other will be referred to as a "first overlap region" for the sake of convenience. Additionally, the orthographic projection image of the second active region is not included in a region where the orthographic projection image of the control electrode and the orthographic projection image of the first-B active region overlap with each other (hereinafter referred to as a "second overlap region" for the sake of convenience). Therefore, a difference is generated between capacitance in the first overlap region and capacitance in the second overlap region, and as a result, a difference is generated between potential in the first overlap region and potential in the second overlap region, and the tunnel current easily flows in an end portion of the second active region located in a boundary region between the first overlap region and the second overlap region. Additionally, $L_{1-Y} < L_{2-Total}$ is satisfied. Therefore, as a result of the above, power consumption of the tunnel field-effect transistor can be reduced. Furthermore, in the tunnel field-effect transistor according to the second aspect of the present disclosure, the insulation region is formed under the first-b active region, and therefore, a capacitance difference is generated between the first overlap region and the second overlap region, and tunnel easily flows in the end portion of the second active region in a manner similar to the first aspect. Additionally, since the first-a active region includes the first-$a_2$ active region and the first-$a_1$ active region having the impurity concentration lower than the impurity concentration of the first-$a_2$ active region, the first-$a_1$ active region is easily depleted, and parasitic capacitance can be reduced. Furthermore, since the first-b active region has the characteristic as the first conductivity type, the first-$a_1$ active region, the first-b active region, and the first active region extension portion are connected as a region having the first conductivity type. Note that the effects recited in the present specification are only examples and not limited thereto, and there may be an additional effect.

MODE FOR CARRYING OUT THE INVENTION

Figure 1A:
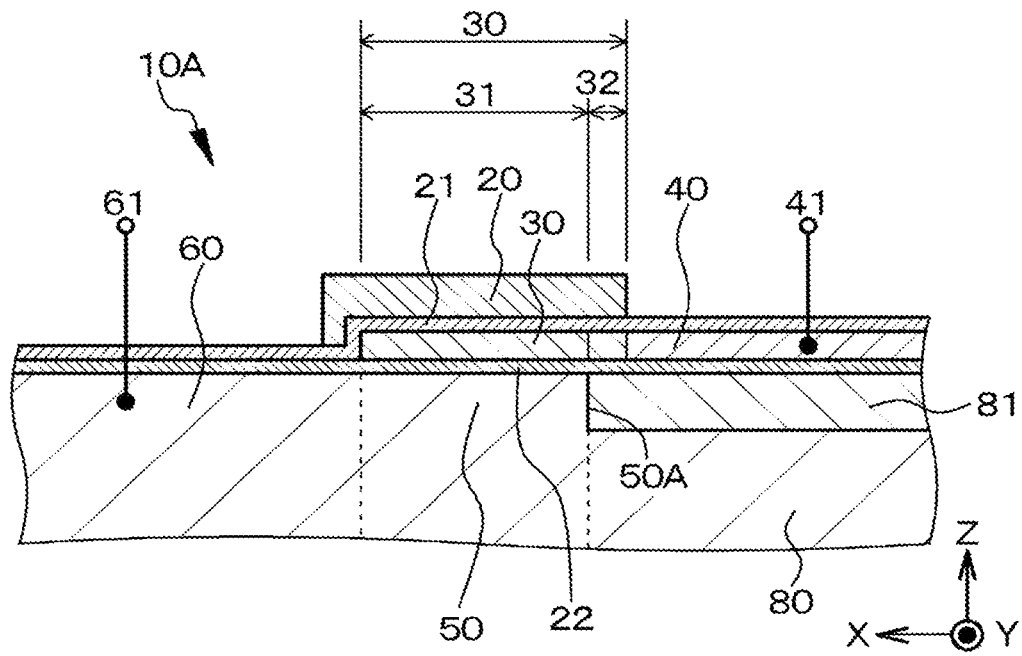
FIGS. 1A and 1B are, respectively: a schematic partial cross-sectional view of a tunnel field-effect transistor of Example 1; and a diagram schematically illustrating an arrangement relation between a control electrode, and a first active region a second active region, and the like in the tunnel field-effect transistor of Example 1.

In the following, the present disclosure will be described with reference to the drawings on the basis of Examples, but note that the present disclosure is not limited to such Examples, and various kinds of values and materials in such Examples are illustrative. Note that a description will be provided in the following order.

1. General Description of Tunnel Field-Effect Transistor According to First Aspect to Second Aspect of Present Disclosure 2. Example 1 (tunnel field-effect transistor according to first aspect of present disclosure)

3. Example 2 (modified example of Example 1)

4. Example 3 (modified example of Example 2)

5. Example 4 (another modified example of Example 2)

6. Example 5 (another modified example of Example 1 to Example 4)

7. Example 6 (tunnel field-effect transistor according to second aspect of the present disclosure)

8. Others

<General Description of Tunnel Field-Effect Transistor According to First Aspect to Second Aspect of Present Disclosure>

In a tunnel field-effect transistor according to a first aspect of the present disclosure, an orthographic projection image of a control electrode and an orthographic projection image of a first active region at least partly overlap with each other, but there may also be following cases:

(A-1) the orthographic projection image of the control electrode and the orthographic projection image of the first active region partly overlap with each other;

(A-2) the orthographic projection image of the first active region is included in the orthographic projection image of the control electrode;

(A-3) the orthographic projection image of the control electrode and the orthographic projection image of the first active region coincide with each other; and (A-4) the orthographic projection image of the control electrode is included in the orthographic projection image of the first active region.

Additionally, a relation between the orthographic projection image of the control electrode and the orthographic projection image of the first-A active region may include following cases:

(B-1) the orthographic projection image of the control electrode and the orthographic projection image of the first-A active region partly overlap with each other;

(B-2) the orthographic projection image of the first-A active region is included in the orthographic projection image of the control electrode;

(B-3) the orthographic projection image of the control electrode and the orthographic projection image of the first-A active region coincide with each other; and (B-4) the orthographic projection image of the control electrode is included in the orthographic projection image of the first-A active region.

All or a part of a boundary between the first-A active region and a first-B active region is included in the orthographic projection image of the control electrode.

Furthermore, a relation between an orthographic projection image of a second active region and the orthographic projection image of the first-A active region may include following cases:

(C-1) the orthographic projection image of the second active region and the orthographic projection image of the first-A active region partly overlap with each other;

(C-2) the orthographic projection image of the first-A active region is included in the orthographic projection image of the second active region;

(C-3) the orthographic projection image of the second active region and the orthographic projection image of the first-A active region coincide with each other; and (C-4) the orthographic projection image of the second active region is included in the orthographic projection image of the first-A active region.

In the tunnel field-effect transistor according to the first aspect of the present disclosure, the second active region can be surrounded by an insulation region, and a first-B active region can be formed on the insulation region. Additionally, in this case, an insulation material constituting the insulation region can include an insulation material having low permittivity (so-called low-k material).

In the tunnel field-effect transistor according to the first aspect of the present disclosure including the above-described preferable modes, the first-A active region can be surrounded by the first-B active region, the second active region extension portion can include: a second-A active region extension portion contacting the second active region and having an orthographic projection image partly overlapping with an orthographic projection image of the first-B active region; and a second-B active region extension portion extending from the second-A active region extension portion, and a distance $H_{2-A}$ in a Z direction (vertical direction) between the second-A active region extension portion and the first active region can be longer than a distance $H_2$ in the Z direction (vertical direction) between the second active region and the first active region. Additionally, in this case, an end portion of a part of the first-B active region can be located above the second-A active region extension portion, and this can suppress tunnel leakage current from flowing between the first-A active region and the second active region when voltage applied to the control electrode is low.

In the tunnel field-effect transistor according to the first aspect of the present disclosure the above-described various preferable modes, the first-A active region can include a first-$A_1$ active region and a first-$A_2$ active region surrounding the first-$A_1$ active region, the first-$A_2$ active region, the first-B active region, and the first active region extension portion can each have a characteristic as a first conductivity type, the second active region can have a characteristic as a second conductivity type different from the first conductivity type, and the first-$A_1$ active region can have an impurity concentration lower than an impurity concentration of the first-$A_2$ active region. Here, the first-$A_1$ active region may also have the characteristic as the first conductivity type, the characteristic as the second conductivity type, or a characteristic as intrinsic. Additionally, it is desirable that the impurity concentration of the first-$A_1$ active region be 10% or less, preferably 5% or less, and more preferably 1% or less of the impurity concentration of the first-$A_2$ active region. Alternatively, it is desirable that the impurity concentration of the second region be $1 \times 10^{18}$ cm$^{-3}$ or less, preferably $1 \times 10^{16}$ cm$^{-3}$ or less, and more preferably $1 \times 10^{15}$ cm$^{-3}$ or less.

Alternatively, in the tunnel field-effect transistor according to the first aspect of the present disclosure the above-described various preferable modes, the second active region can include a plurality of protruding second active region segments, and a recess between a second active region segment and a second active region segment can be embedded with an insulation material. Additionally, in this case, a planar shape of each second active region segment can have a strip shape, or alternatively, the plurality of second active region segments can be arrayed in a two-dimensional matrix shape. The plurality of second active region segments arrayed in the two-dimensional matrix shape may be arrayed regularly or arrayed in an irregular state. Additionally, an array direction may be regular or may be irregular. Furthermore, in the above-described various configurations, a portion of the first active region facing the recess can have the characteristic as the first conductivity type, the second active region can have the characteristic as the second conductivity type different from the first conductivity type, and a portion of the first active region facing the second active region segment can include: a first region having the characteristic as the first conductivity type; and a second region surrounded by the first region and having an impurity concentration lower than an impurity concentration of the first region. Here, the second region may have the characteristic as the first conductivity type, the characteristic as the second conductivity type, or the characteristic as intrinsic. Additionally, it is desirable that the impurity concentration of the second region be 10% or less, preferably 5% or less, and more preferably 1% or less of the impurity concentration of the first region. Alternatively, it is desirable that the impurity concentration of the second region be $1 \times 10^{18}$ cm$^{-3}$ or less, preferably $1 \times 10^{16}$ cm$^{-3}$ or less, and more preferably $1 \times 10^{15}$ cm$^{-3}$ or less. The insulation region may extend to the recess.

In the tunnel field-effect transistor according to the first aspect of the present disclosure including the various preferable modes and the various preferable configurations described above, a semiconductor layer having the first conductivity type can be formed below the first-B active region, and the second active region can have the second conductivity type different from the first conductivity type. Additionally, in this case, voltage different from voltage applied to the second active region is applied to the semiconductor layer.

Furthermore, in the tunnel field-effect transistor according to the first aspect of the present disclosure including the various preferable modes and the various preferable configurations described above, and in a tunnel field-effect transistor according to a second aspect of the present disclosure, the first active region and the first active region extension portion can each include a two-dimensional material or graphene.

Furthermore, in the tunnel field-effect transistor according to the first aspect of the present disclosure including the various preferable modes and the various preferable configurations described above, and in the tunnel field-effect transistor according to the second aspect of the present disclosure including the above-described preferable modes, the second active region and the second active region extension portion can include a silicon semiconductor substrate including an SOI substrate, a germanium (Ge) substrate, or a silicon-germanium (Si—Ge) substrate, or the second active region and the second active region extension portion can include a two-dimensional material or graphene. In a case of providing a complementary transistor, it is sufficient to have three kinds of materials constituting an active region of the complementary transistor at maximum, and the number of kinds of the constituent materials of the active region or the like of the complementary transistor can be reduced, and furthermore, a manufacture process can be simplified.

Furthermore, in the tunnel field-effect transistor according to the first aspect of the present disclosure including the various preferable modes and the various preferable configurations described above, and in the tunnel field-effect transistor according to the second aspect of the present disclosure including the above-described various preferable modes, an extending direction of the first active region and a length direction of the control electrode can be parallel, and with this mode, an overlap region between the first active region and the control electrode can be surely formed.

Furthermore, in the tunnel field-effect transistor according to the first aspect of the present disclosure including the various preferable modes and the various preferable configurations described above, and in the tunnel field-effect transistor according to the second aspect of the present disclosure including the above-described various preferable modes, it is preferable to form an insulation layer (referred to as "first insulation layer" for convenience) between the control electrode and the first active region and further preferable to provide a second insulation layer between the first active region and the second active region from the view point of stability of operation, although not indispensable. However, if a state of an energy band between the first active region and the second active region can be changed, it may be unnecessary to provide the first insulation layer and the second insulation layer. These insulation layers may each include a natural oxide film. Also, a stacked layer using weak Van der Waals force is also adoptable.

Furthermore, in the tunnel field-effect transistor according to the first aspect of the present disclosure including the various preferable modes and the various preferable configurations described above, and in the tunnel field-effect transistor according to the second aspect of the present disclosure including the above-described various preferable modes, electrons are moved between the first active region and the second active region due to a tunnel effect by applying voltage to each of the control electrode, the first active region extension portion, and the second active region extension portion, and a conduction state can be achieved by such movement of the electrons. Specifically, it is possible to exemplify a mode in which $V_{dd}$ (>0 volts) is applied to each of the control electrode and the first active region extension portion to earth the second active region extension portion.

In the description of the tunnel field-effect transistor according to the first aspect of the present disclosure including the various preferable modes and the various preferable configurations described above or in the description of the tunnel field-effect transistor according to the second aspect of the present disclosure including the above-described various preferable modes (hereinafter, these tunnel field-effect transistors will be collectively referred to as "the tunnel field-effect transistor or the like of the present disclosure"), an expression "having the characteristic as the first conductivity type" specifically means having behavior as an n type or having an electron donating property, and an expression "having the characteristic as the second conductivity type" specifically means having behavior as a p type or having an electron accepting property or represents a state containing a p-type impurity. Additionally, in this case, the tunnel field-effect transistor or the like of the present disclosure corresponds to an n-channel FET. Furthermore, the first active region corresponds to a drain region in the FET, the second active region corresponds to a source region in the FET, and the control electrode corresponds to a gate electrode in the FET.

However, not limited to the above, the expression "having the characteristic as the first conductivity type" specifically means having behavior as the p type or having the electron accepting property, and the expression "having the characteristic as the second conductivity type" specifically means having behavior as the n type or having the electron donating property or represents a state containing an n-type impurity. Additionally, in this case, the tunnel field-effect transistor or the like of the present disclosure corresponds to a p-channel FET. Furthermore, the first active region corresponds to a drain region in the FET, the second active region corresponds to a source region in the FET, and the control electrode corresponds to a gate electrode in the FET. Between the case where the tunnel field-effect transistor or the like of the present disclosure is the tunnel field-effect transistor corresponding to the n-channel FET and the case where the tunnel field-effect transistor and the like of the present disclosure is the tunnel field-effect transistor corresponding to the p-channel FET, voltage applied to the control electrode, the first active region extension portion, the second active region extension portion is to be inverse. Specifically, for example, in a case of applying positive voltage in the former tunnel field-effect transistor, negative voltage is to be applied in the latter tunnel field-effect transistor.

In the tunnel field-effect transistor or the like of the present disclosure, a second control electrode may be provided below the second active region. In other words, a so-called double gate structure may be adopted.

Specific examples of the two-dimensional material can include a transition metal dichalcogenide (TMDC) series material. The TMDC is represented as $MX_2$, for example, and examples of a transition metal "M" can include Ti, Zr, Hf, V, Nb, Ta, Mo, W, Tc, and Re, and examples of a chalcogen element "X" can include O, S, Se, and Te. Alternatively, it is also possible to exemplify CuS that is a compound of Cu corresponding to the transition metal and S corresponding to the chalcogen element, or it is possible to adopt a compound (such as GaS, GaSe, GaTe, $In_2Se_3$, $InSn_2$, $SnSe_2$, GeSe, $SnS_2$, or PbO) of a non-transition metal such as Ga, In, Ge, Sn, or Pb and the chalcogen element. Alternatively, an exemplary material of a two-dimensional material constituting the first active region and the second active region in the tunnel field-effect transistor or the like of the present disclosure can include black phosphorus.

More specifically, an example of a two-dimensional material having the characteristic as the first conductivity type can include at least one kind of two-dimensional material selected from a group including $MoSe_2$, $MoTe_2$, $WSe_2$, $MoS_2$, $WTe_2$, $ZrTe_2$, and $HfTe_2$, and an exemplary thickness thereof can be 0.65 nm to 6.5 nm, preferably, 0.65 nm to 2.6 nm. On the other hand, an example of a two-dimensional material having the characteristic as the second conductivity type can include at least one kind of two-dimensional material selected from a group including $MoS_2$, $WS_2$, $ZrS_2$, $ZrSe_2$, $HfS_2$, $HfSe_2$, $NbSe_2$, and $ReSe_2$, and an exemplary thickness thereof can be 0.65 nm to 6.5 nm, preferably, 0.65 nm to 2.6 nm. However, the examples are not limited thereto. Note that values of $E_C$(eV) and $E_V$(eV) of various kinds of materials are listed in a table below.

| Materials constituting substrate | $E_C$ (eV) | $E_V$ (eV) |
|---|---|---|
| Silicon | 5.17 | 4.05 |
| Germanium | 4.66 | 4.00 |
| Two-dimensional materials | | |
| $MoS_2$ | 5.86 | 4.27 |
| $MoSe_2$ | 5.23 | 3.90 |
| $MoTe_2$ | 4.76 | 3.83 |
| $WS_2$ | 5.50 | 3.96 |
| $WSe_2$ | 4.87 | 3.54 |
| $WTe_2$ | 4.44 | 3.69 |
| $ZrS_2$ | 6.79 | 5.71 |
| $ZrSe_2$ | 6.15 | 5.86 |
| $ZrTe_2$ | 4.97 | 5.69 |
| $HfS_2$ | 6.83 | 5.59 |
| $HfSe_2$ | 6.17 | 5.72 |
| $HfTe_2$ | 4.91 | 5.53 |

The two-dimensional materials may be doped in order to impart the characteristic as the first conductivity type or the second conductivity type. Examples of the doping method can include a method of replacing "M" or "X" of TMD C represented by $MX_2$ with an impurity, a method of defecting "M" or "X", and a method of adsorbing an impurity to an interface of the two-dimensional material, and specifically, an ion implantation method, a chemical doping method, and a solid phase diffusion method can be exemplified. Examples of a doping material to impart the characteristic as the first conductivity type (n type) can include nicotinamide mononucleotide-H (NMNH), nicotinamide adenine dinucleotide-H (NADH), nicotinamide adenine dinucleotide phosphate-H (NADPH), polyethylenimine (PEI), and alkali metals such as potassium and lithium. Additionally, examples of a doping material to impart the characteristic as the second conductivity type (p type) can include: ionic liquid such as $NO_2BF_4$, $NOBF_4$, and $NO_2SbF_6$; acid compounds such as HCl, $H_3PO_4$, $CH_3COOH$, $H_2SO_4$, and $HNO_3$; organic compounds such as dichlorodicyanoquinone, oxone, dimyristoylphosphatidylinositol, and trifluoromethanesulfonimide; $HPtCl_4$, $AuCl_3$; $HAuCl_4$; silver trifluoromethanesulfonate; $AgNO_3$; $H_2PdCl_6$; $Pd(OAc)_2$; $Cu(CN)_2$; and the like.

As a method of forming the first active region including the first active region extension portion (in some cases, as a method of forming the second active region including the second active region extension portion), the following methods can be exemplified. Specifically,

[a] a method of forming a precursor of a transition metal chalcogenide series material into a thin film on a base (foundation layer), and then applying heat treatment thereto

[b] a method of forming a thin film including a transition metal oxide on a base (foundation layer), and then reacting a transition metal of the transition metal oxide with chalcogen of a material containing a chalcogen element.

In the tunnel field-effect transistor or the like of the present disclosure, in a case where the second active region including the second active region extension portion includes the two-dimensional material or graphene, it is advisable that the second active region including the second active region extension portion be provided on, for example, a silicon semiconductor substrate having a surface on which an insulation film is formed.

The graphene represents a sheet-like substance having a thickness of 1 atom and including $sp^2$-bonded carbon atoms, and has a hexagonal lattice structure like a honeycomb made from carbon atoms and by atomic bond thereof. Chemical doping is to be performed in order to dope a graphene film with a n-type or p-type impurity. To perform chemical doping, specifically, a dopant layer is to be formed on the graphene film. The dopant layer can be an electron accepting (p-type) dopant layer or an electron donating (n-type) dopant layer. Examples of a material constituting the electron accepting (p-type) dopant layer can include: chlorides such as AuCl, $HAuCl_4$, and $PtCl_4$; acids such as $HNO_3$, $H_2SO_4$, HCl, and nitromethane; III group elements such as boron and aluminum; and an electron-attracting molecule such as oxygen. Examples of a material constituting the electron donating (n-type) dopant layer can include not only a V group element such as nitrogen and phosphorus but also a pyridine series compound, a nitride, alkali metals, and electron donating molecules such as an aromatic compound including an alkyl group.

The graphene can be formed by, for example, a manufacturing method described below. In other words, a film containing a graphenization catalyst is deposited on a base material. Then, a gas-phase carbon supply source is supplied to the film containing the graphenization catalyst, and at the same time, heat treatment is applied to the gas-phase carbon supply source to form the graphene. After that, film-like graphene can be formed on the film containing the graphenization catalyst by cooling the graphene at a predetermined cooling rate. Examples of the graphenization catalyst can include not only a carbon compound such as SiC but also at least one kind of metal selected from among Ni, Co, Fe, Pt, Au, Al, Cr, Cu, Mg, Mn, Mo, Rh, Si, Ta, Ti, W, U, V, and Zr. Additionally, examples of the gas-phase carbon supply source can include at least one kind of a carbon source selected from among a carbon monoxide, methane, ethane, ethylene, ethanol, acetylene, propane, butane, butadiene, pentane, pentene, cyclopentadiene, hexane, cyclohexane, benzene, and toluene. Then, the graphene can be obtained by separating the film-like graphene formed as described above from the film containing the graphenization catalyst.

In the tunnel field-effect transistor or the like of the present disclosure, examples of a material constituting the control electrode can include polysilicon, polycide, a metal silicide, a metal nitride (e.g., TiN), metals such as aluminum (Al) and gold (Au), graphene, ITO, and the like, and exemplary methods of forming the control electrode can include various kinds of physical vapor deposition method (PVD method) including a vacuum deposition method and a sputtering method, and various kinds of chemical vapor deposition method (CVD method).

The first active region extension portion, the second active region extension portion, and the control electrode are connected to a power supply unit. The first active region extension portion may be provided with a first electrode to establish connection to the power supply unit, and the second active region extension portion may be provided with a second electrode to establish connection to the power supply unit. Examples of a material constituting the first electrode and the second electrode can include: polysilicon doped with an impurity; aluminum; high-melting point metals such as tungsten, Ti, Pt, Pd, Cu, TiW, TiNW, $WSi_2$, and $MoSi_2$ and a conductive material containing a metal silicide, and exemplary methods of forming these electrodes can include the various kinds of PVD method and the various kinds of CVD method.

Examples of a material constituting the first insulation layer can include not only an $SiO_X$ series material such as a silicon oxide ($SiO_2$), an SiOF series material, a SiN series material, or a SION series material but also a so-called high dielectric constant material having a dielectric constant k ($=\varepsilon/\varepsilon_0$) of about 4.0 or more. Examples of the high dielectric constant material can include: metal oxide materials such as a hafnium oxide ($HfO_2$), a zirconium oxide ($ZrO_2$), an aluminum oxide ($Al_2O_3$), an aluminum hafnium oxide ($HfAlO_2$), a silicon hafnium oxide (HfSiO), a tantalum oxide ($Ta_2O_5$), an yttrium oxide ($Y_2O_3$), and a lanthanum oxide ($La_2O$); and metal nitride materials. Alternatively, an insulation material including metal silicates such as HfSiO, HfSiON, ZrSiO, AlSiO, and LaSiO can also be exemplified. The first insulation layer may include one kind of material or a plurality of kinds of materials. Additionally, the first insulation layer may have a single layer configuration or may be a multi-layer configuration. Exemplary methods of forming the first insulation layer can include: the various kinds of CVD method including an atomic layer deposition (ALD) method, a metal organic chemical vapor deposition method (NOCVD method); and the various kinds of PVD method including the vacuum deposition method and the sputtering method. An exemplary thickness of the first insulation layer can be 1 nm to 10 nm.

Examples of a material constituting the second insulation layer can include: a material constituting the above-described first insulation layer; and hexagonal boron nitride (hBN). Exemplary methods of forming the second insulation layer can include: a low temperature oxidation method; a plasma CVD; an ALD; and the like. An exemplary thickness of the second insulation layer can be 1 nm to 3 nm.

Examples of the insulation material having low permittivity (low-k material) can include: low permittivity insulation materials such as an organic SOG, an insulation material containing a fluorine element (such as SiOF), a polyimide resin, and a fluorine resin (e.g., fluorocarbon, amorphous tetrafluoroethylene, polytetrafluoroethylene, polyarylether, fluorinated aryl ether, fluorinated polyimide, parylene, benzocyclobutene, amorphous carbon, cycloperfluorocarbon polymer, fluorinated fullerene); Silk (trademark owned by The Dow Chemical Co., and coating-type interlayer insulation film material having low permittivity); and Flare (trademark owned by Honeywell Electronic Materials Co., and polyarylether (PAE) series material). In some cases, the insulation region can include a cavity.

Examples of a material constituting the semiconductor layer having the first conductivity type can include polysilicon doped with an impurity of the first conductivity type. The semiconductor layer is applied with voltage different from the voltage applied to the second active region, and specifically, the semiconductor layer is applied with the voltage higher than the voltage applied to the second active region.

The tunnel field-effect transistor or the like of the present disclosure can constitute, for example, a so-called complementary transistor, and can also constitute: a logic circuit such as an inverter circuit, a NAND circuit, an AND circuit, a NOR circuit, an OR circuit, an XOR circuit, or a NOT circuit; and an SRAM circuit, but the present invention is not limited thereto.

EXAMPLE 1

Figure 1B:
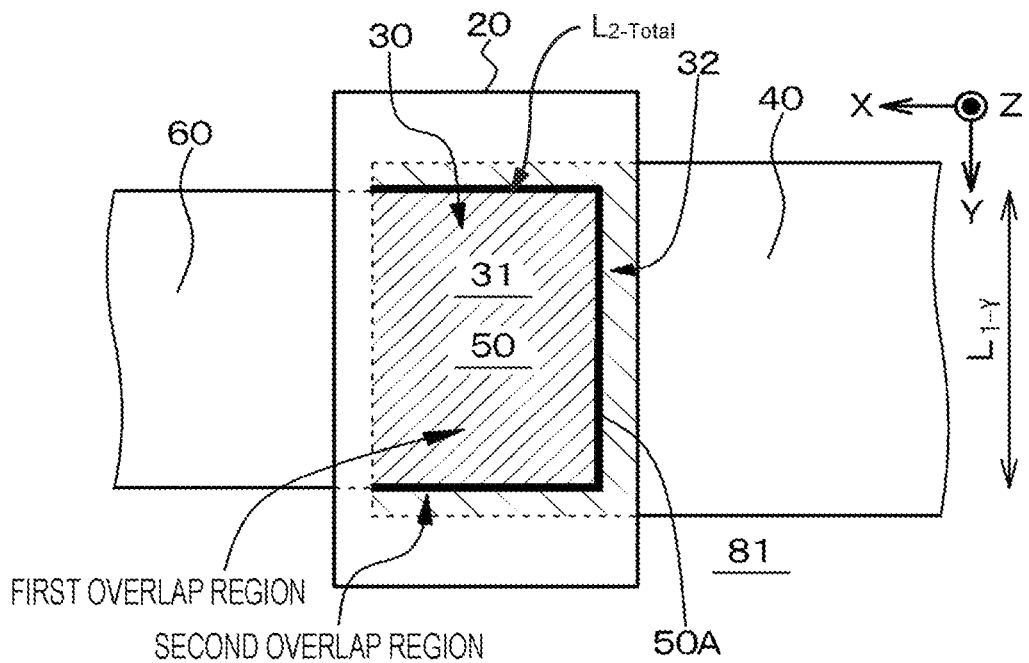
Figure 2A:
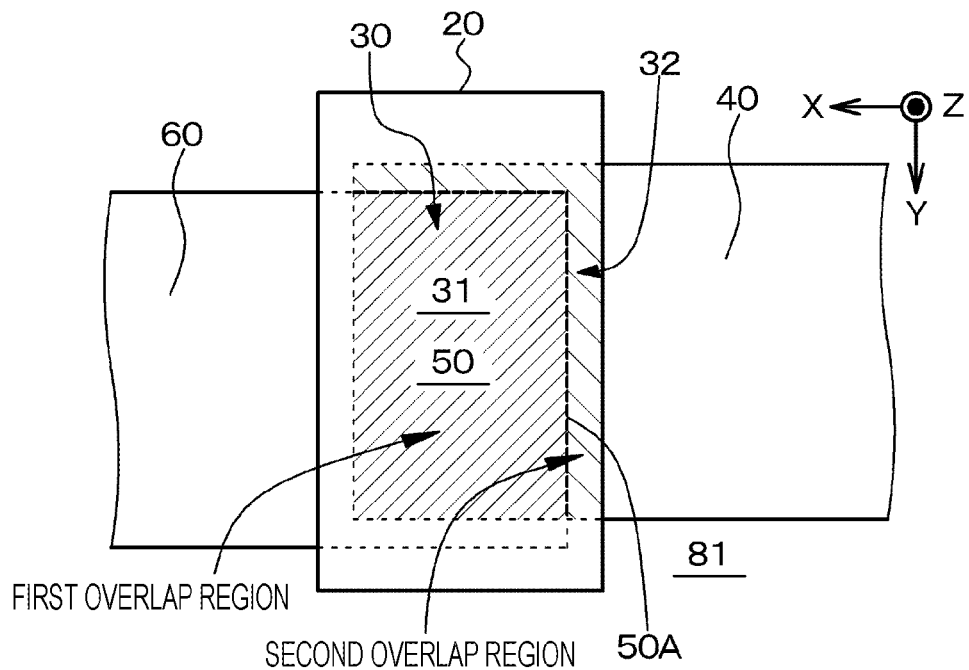
FIGS. 2A and 2B are diagrams schematically illustrating modified examples of the arrangement relation between the control electrode, and the first active region the second active region, and the like in the tunnel field-effect transistor of Example 1 illustrated in FIG. 1A.
Figure 2B:
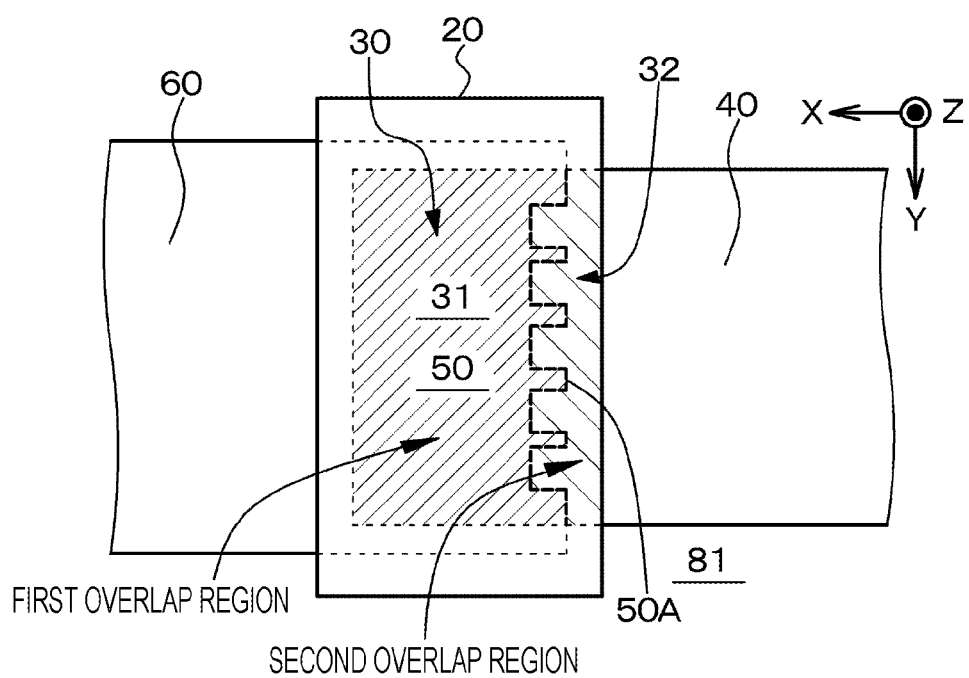

Example 1 relates to the tunnel field-effect transistor according to the first aspect of the present disclosure. FIG. 1A illustrates a schematic partial cross-sectional view of a tunnel field-effect transistor of Example 1, and FIG. 1B, 2A, or 2B illustrates a schematic arrangement relation between the control electrode, and the first active region and the first active region extension portion.

A tunnel field-effect transistor 10A of Example 1 includes:
a first active region 30;
a second active region 50 provided under the first active region 30;
a control electrode 20 provided on the first active region 30;
a first active region extension portion 40 extending from the first active region 30; and
a second active region extension portion 60 extending from the second active region 50. Additionally,
the first active region 30 includes a first-A active region 31 and a first-B active region 32 located at least between the first-A active region 31 and the first active region extension portion 40,
an orthographic projection image of the control electrode 20 and an orthographic projection image of the first active region 30 at least partly overlap with each other,
the second active region 50 exists below the first-A active region 31,
the second active region 50 does not exist below the first-B active region 32, and
$L_{1-Y} < L_{2-Total}$ is satisfied in cases where:
a total extension length of an end portion 50A of a portion of the second active region 50 where an orthographic projection image of the second active region 50 overlaps with the orthographic projection image of the first active region 30 is defined as $L_{2-Total}$; and
when a direction extending from the first active region 30 to the first active region extension portion 40 is defined as an X direction and a stacked direction of the second active region 50, the first active region 30, and the control electrode 20 is defined as a Z direction, a length in a Y direction of the first active region 30 overlapping with the orthographic projection image of the second active region 50 is defined as $L_{1-Y}$. In Example 1, the orthographic projection image of the first active region 30 is included in the orthographic projection image of the control electrode 20. The first active region extension portion 40 and the second active region extension portion 60 face each other interposing the control electrode 20. Note that, in FIGS. 1B, 2A, 2B, 4A, 5A, 7A, and 8A, hatching lines directed from the upper left to the lower right are illustrated in order to clearly indicate a second overlap region (region where the orthographic projection image of the control electrode 20 and an orthographic projection image of the first-B active region 32 overlap with each other). Additionally, in FIGS. 1B, 2A, 2B, 4B, 5B, 7B, 8B, 9B, 10, 12A, and 12B, hatching lines directed from the upper right to the lower left are illustrated in order to clearly indicate a first overlap region (region where an orthographic projection image of the first-A active region 31 and the orthographic projection image of the second active region 50 overlap with each other).

The second active region 50 is surrounded by an insulation region 81. Additionally, the first-B active region 32 is formed on the insulation region 81. Here, an insulation material constituting the insulation region 81 includes an insulation material having low permittivity, specifically, SiOF having a dielectric constant of 3.4 to 3.7. The insulation region 81 has a so-called shallow trench (STI) structure. The insulation region 81 is formed in the silicon semiconductor substrate 80. The second active region extension portion 60 is also surrounded by the insulation region 81. The first active region 30 and the control electrode 20 exist above a portion of the insulation region 81 adjacent to the second active region 50.

In the tunnel field-effect transistor of Example 1, the orthographic projection image of the control electrode 20 and the orthographic projection image of the first active region 30 at least partly overlap with each other, but specifically, the orthographic projection image of the first active region 30 is included in the orthographic projection image of the control electrode 20. Additionally, the orthographic projection image of the first-A active region 31 is included in the orthographic projection image of the control electrode 20. Furthermore, an entire boundary between the first-A active region 31 and the first-B active region 32 is included in the orthographic projection image of the control electrode 20. Moreover, the orthographic projection image of the second active region 50 is included in the orthographic protection image of the first-A active region 31, or the orthographic projection image of the first-A active region 31 is included in the orthographic projection image of the second active region 50.

Here, the first-B active region 32 is located at least between the first-A active region 31 and the first active region extension portion 40, but specifically, as illustrated in FIG. 1B, the first-B active region 32 is located in a region interposed between: three sides of the second active region 50 (specifically, three sides facing the first active region extension portion and including one side extending in the Y direction and two sides extending in the X direction); and an outer edge portion of the first active region. In other words, a planar shape of the first-B active region 32 has a "U" shape when the first-B active region 32 is viewed from the control electrode side. The end portion 50A of the Portion of the second active region 50 where the orthographic projection image of the second active region 50 and the orthographic projection image of the first active region 30 overlap with each other is indicated by a thick dashed line in the drawings. The similar is applied in the following. Additionally, $$L_{1-Y} < L_{2-Total}$$

is satisfied. Note that the three sides of the second active region 50 can have any shape.

Alternatively, as illustrated in FIG. 2A, the first-B active region 32 is located in a region interposed between: two sides of the second active region 50 (specifically, two sides facing the first active region extension portion and including one side extending in the Y direction and one side extending in the X direction); and the outer edge portion of the first active region. In other words, the planar shape of the first-B active region 32 has an "L" shape when the first-B active region 32 is viewed from the control electrode side. In this case also, $$L_{1-Y} < L_{2-Total}$$

is satisfied. Note that the two sides of the second active region 50 can have any shape.

Alternatively, as illustrated in FIG. 2B, the first-B active region 32 is located in a region interposed between: one side of the second active region 50 (specifically, one side facing the first active region extension portion and including one side extending in the Y direction; and the outer edge portion of the first active region. Here, the one side of the second active region 50 has a zigzag shape, for example. In this case also, $$L_{1-Y} < L_{2-Total}$$

is satisfied. Note that the one side of the second active region 50 may be any shape as far as the shape is not a line segment.

The first active region 30 and the first active region extension portion 40 include a two-dimensional material or graphene, specifically, a two-dimensional material with a thickness of 1 nm, such as $MoS_2$, and have the characteristic as the first conductivity type. In other words, behavior as the n type is exhibited or the electron donating property is provided. Additionally, the second active region 50 and the second active region extension portion 60 include the silicon semiconductor substrate 80, and have the second conductivity type (specifically, the p type). An insulation layer (first insulation layer 21) including a hafnium oxide ($HfO_2$) with a thickness of 1 nm is formed between the control electrode 20 and the first active region 30, and a second insulation layer 22 including $HfO_2$ with a thickness of nm is provided between the first active region 30 and the second active region 50. The control electrode 20 includes TiN, for example. An extending direction of the first active region 30 and a length direction of the control electrode 20 are parallel and correspond to the X direction. The direction perpendicular to the length direction of the control electrode 20 (a width direction of the control electrode 20) corresponds to the Y direction. Since the second active region 50 and the second active region extension portion 60 include the silicon semiconductor substrate 80, in a case of providing a complementary transistor, it is sufficient to have three kinds of materials constituting an active region of the complementary transistor at maximum, and the number of the materials constituting the active region and the like of the complementary transistor can be reduced, and furthermore, a manufacturing process can be simplified.

Furthermore, electrons are moved between the first active region 30 and the second active region 50 due to a tunnel effect by applying voltage to each of the control electrode 20, the first active region extension portion 40, and the second active region extension portion 60, thereby bringing the tunnel field-effect transistor 10A into a conduction state. Specifically, $V_{dd}$ (>0 volts) is applied to each of the control electrode 20 and the first active region extension portion 40 to earth the second active region extension portion 60, for example. The first active region extension portion 40 is provided with a first electrode 41 including platinum (Pt) to establish connection to the power supply unit, and the second active region extension portion 60 is provided with a second electrode 61 including platinum (Pt) to establish connection to the power supply unit. Note that the first electrode 41 and the second electrode 61 are conceptually illustrated in the drawings.

Hereinafter, an outline of a manufacturing method of the tunnel field-effect transistor of Example 1 will be described.

[Step-100]

First, the insulation region 81 having a shallow trench structure is formed in the n-type silicon semiconductor substrate 80 on the basis of a known method. Subsequently, a surface of a region of the silicon semiconductor substrate 80 surrounded by the insulation region 81 is set to the second conductivity type (specifically, p type) on the basis of the ion implantation method. Thus, the second active region 50 and the second active region extension portion 60 can be obtained. The silicon semiconductor substrate 80 located below the second active region 50 and the second active region extension portion 60 is an n-type region.

[Step-110]

Next, the second insulation layer 22 is formed on the surface of the silicon semiconductor substrate 80 (specifically, on the surface of the silicon semiconductor substrate 80 and on the insulation region 81 in Example 1).

[Step-120]

Next, the first active region 30 and the first active region extension portion 40 can be obtained by forming a two-dimensional material layer on the second insulation layer 22 by the CVD method and then performing patterning into a desired shape.

[Step-130]

After that, the first insulation layer 21 is formed on the entire surface. Then, the control electrode 20 is formed on the first insulation layer 21. Thus, the tunnel field-effect transistor of Example 1 having the configuration and the structure illustrated in FIG. 1A can be obtained.

[Step-140]

After that, an interlayer insulation layer is formed on the entire surface, and the first electrode 41 and the second electrode 61 are to be formed on the first active region extension portion 40 and the second active region extension portion 60.

Parasitic capacitance between the control electrode 20 and the first active region 30 is defined as $C_{gd}$. Here, note that a case where the orthographic projection image of the first active region 30 is included in the orthographic projection image of the control electrode 20 will be referred to as a "Case 1", a case where the orthographic projection image of the control electrode 20 and the orthographic projection image of the first active region 30 coincide with each other will be referred to as a "Case 2", and a case where the orthographic projection image of the control electrode 20 is included in the first active region 30 will be referred to as a "Case 3" for the sake of convenience. In Case 1, $C_{gd}$ can be reduced more than in Case 2. In Case 2 and Case 3, $C_{gd}$ is about the same level as that in a stacked structure disclosed in a stacked structure Japanese Patent Application Laid-open No. 2015-090984.

By the way, in a tunnel field-effect transistor having a structure in which the end portion 50A of the second active region 50 is included in the orthographic projection image of the first active region 30, it is known that tunnel current flowing between the first active region 30 and the second active region 50 exclusively flows between the end portion 50A of the second active region 50 and the first active region 30 (see "A computational study of van der Waals tunnel transistors: fundamental aspects and design challenges", Jiang Cao et al., IEDM 15-313 12.5.1-12.5.4, for example).

A phenomenon in which the tunnel current flows between the end portion 50A of the second active region 50 and the first active region 30 can be described as follows. In other words, in the first overlap region, first A capacitance is formed by the control electrode 20, the first insulation layer 21, and the first active region 30, and first B capacitance is formed by the first-A active region 31, the second insulation layer 22, and the second active region 50. On the other hand, in the second overlap region, second A capacitance is formed by the control electrode 20, the first insulation layer 21, and the first active region 30, and a second B capacitance is formed by the first-B active region 32, the insulation region 81, and the p-type region of the silicon semiconductor substrate 80 immediately under the insulation region 81. Here, total capacitance in the second overlap region (capacitance based on the second A capacitance and the second B capacitance) has a value smaller than a value of total capacitance in the first overlap region (capacitance based on the first A capacitance and the first B capacitance). In the example illustrated in FIG. 1A, the first A capacitance and the second A capacitance have the same values, the first B capacitance is larger than the second B capacitance, and the first-B active region 32 of the second overlap region is capacitively firmly bonded to the control electrode 20. Therefore, for example, when $V_{dd}$ (>0 volts) is applied to the first active region extension portion 40 from a state in which 0 volts is applied to each of the control electrode 20, the first active region 30, and the second active region 50, potential in the second overlap region is slightly changed. On the other hand, potential in the first overlap region is not changed. Therefore, there is no change in the state between the first-A active region 31 and the second active region 50, and tunnel current does not flow. Subsequently, when $V_{dd}$ (>0 volts) is applied to the control electrode 20, the potential in the second overlap region is further changed, and at the same time, the potential in the first overlap region is also changed. Then, as a result of the above, the tunnel current starts flowing, but the tunnel current starts flowing in the end portion 50A of the second active region 50 earlier than a center portion of the second active region 50. After that, the tunnel current flowing between the first active region 30 and the second active region 50 continues flowing exclusively between the end portion 50A of the second active region 50 and the first active region 30. Note that the second B capacitance can be made to a smaller value by using an insulation material having low permittivity (so-called low-k material) as the insulation material constituting the insulation region 81.

As described above, in the tunnel field-effect transistor of Example 1 illustrated in FIG. 1A, since the control electrode, the first-A active region, and the second active region overlap with one another, reliable operation of the tunnel field-effect transistor can be assured. Additionally, the orthographic projection image of the second active region is not included in the second overlap region. Therefore, a difference is generated between capacitance in the first overlap region and capacitance in the second overlap region, and as a result, a difference is generated between the potential in the first overlap region and the potential in the second overlap region, and the tunnel current easily flows in the end portion of the second active region located in the boundary region between the first overlap region and the second overlap region. Additionally, $L_{1-Y} < L_{2-Total}$ is satisfied. Therefore, as a result of the above, power consumption of the tunnel field-effect transistor can be reduced.

The second active region 50 and the second active region extension portion 60 may each include an SOI substrate, a germanium substrate, and a silicon-germanium substrate. Additionally, the second active region 50 and the second active region extension portion 60 may each include a two-dimensional material or graphene. In a case where the second active region 50 and the second active region extension portion 60 each include the two-dimensional material, an example of the two-dimensional material can include $WTe_2$, and in this case, the first active region 30 and the first active region extension portion 40 are to include $MoS_2$.

EXAMPLE 2

Figure 3A:
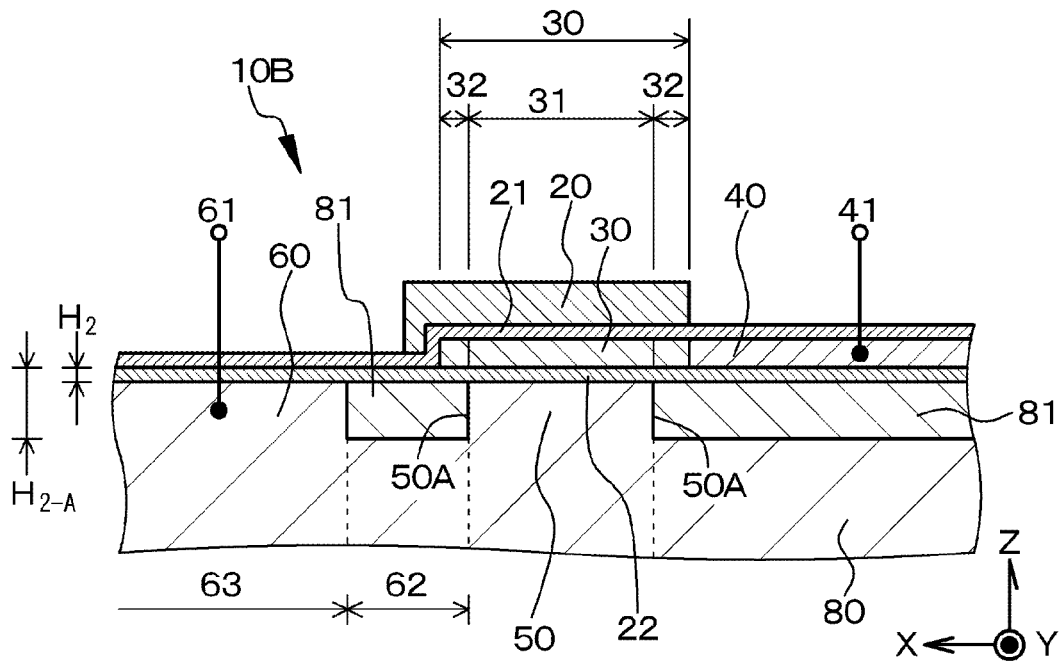
FIGS. 3A and 3B are schematic partial cross-sectional views of a tunnel field-effect transistor of Example 2 and a modified example thereof, respectively.
Figure 4A:
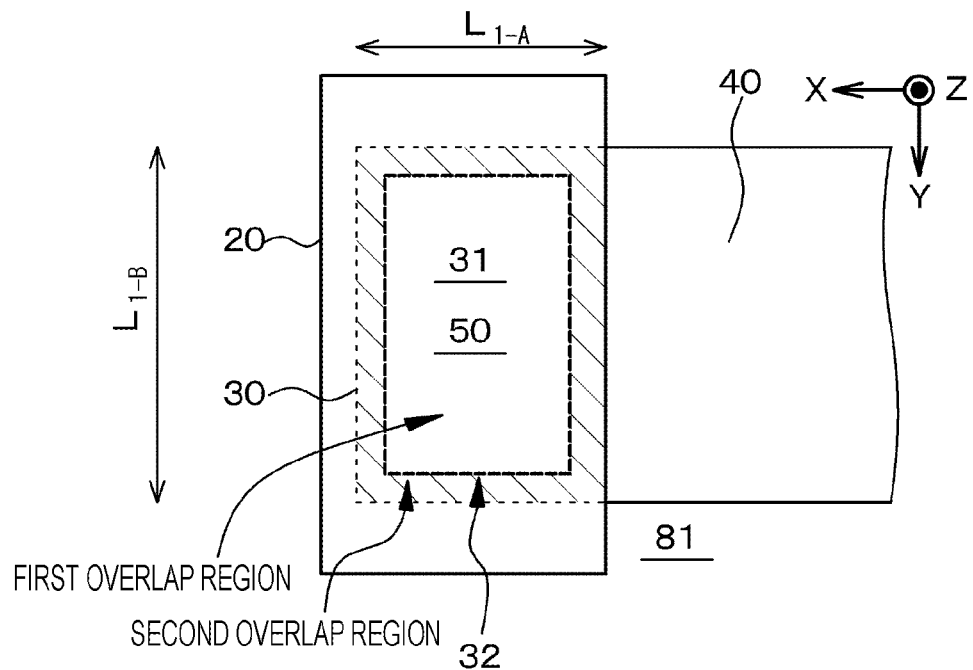
FIGS. 4A and 4B are respectively: a diagram schematically illustrating an arrangement relation between the control electrode, and the first active region and a first active region extension portion; and a diagram schematically illustrating an arrangement relation between the control electrode, and the second active region and a second active region extension portion in the tunnel field-effect transistor of Example 2 illustrated in FIG. 3A.
Figure 4B:
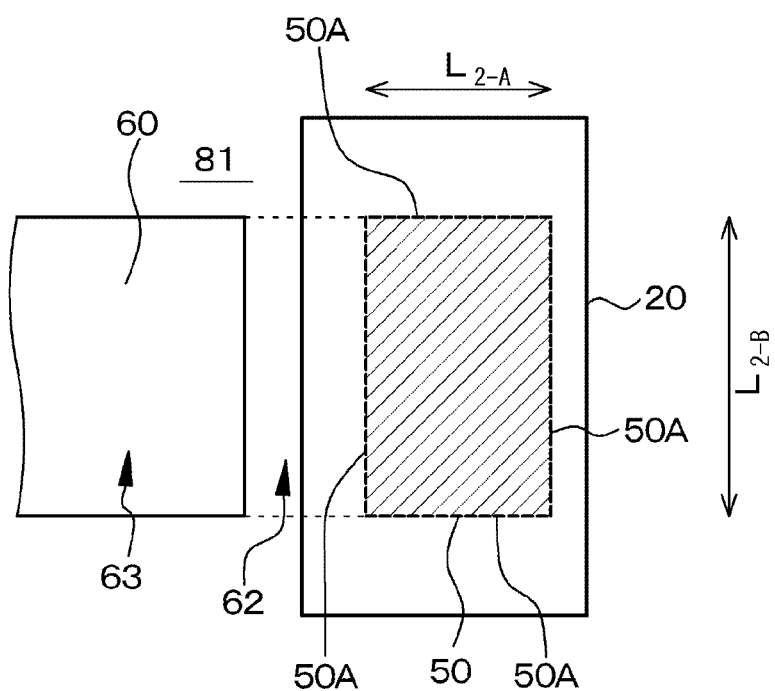

Example 2 is a modified example of Example 1. FIG. 3A illustrates a schematic partial cross-sectional view of a tunnel field-effect transistor of Example 2, FIG. 4A schematically illustrates an arrangement relation between the control electrode, and the first active region and the first active region extension portion, and FIG. 4B schematically illustrates an arrangement relation between the control electrode, and the second active region and the second active region extension portion.

In a tunnel field-effect transistor 10B of Example 2, the first-A active region 31 is surrounded by the first-B active region 32. Then, the second active region extension portion 60 contacts the second active region 50, and includes the second-A active region extension portion 62 where the orthographic projection image of the second active region extension portion 60 partly overlaps with the orthographic projection image of the first-B active region 32, and the second-B active region extension portion 63 extending from the second-A active region extension portion 62. In other words, an end portion of a part of the first-B active region 32 is located above the second-A active region extension portion 62. Additionally, a distance $H_{2-A}$ in the Z direction (vertical direction) between the second-A active region extension portion 62 and the first active region 30 is longer than a distance $H_2$ in the Z direction (vertical direction) between the second active region 50 and the first active region 30. In other words, $H_{2-A} > H_2$ is satisfied. Values of $H_{2-A}$ and $H_2$ are not limited, but $H_{2-A}$=0.25 μm
$H_2$=1 nm can be exemplified. In Example 2, the insulation region 81 is formed on the silicon semiconductor substrate 80 and on the second-A active region extension portion 62.

Additionally, in the tunnel field-effect transistor of Example 2, when a planar shape of the second active region 50 occupying the first overlap region is rectangular, the total extension length $L_{2-Total}$ of the end portion 50A of the second active region 50 is $(2 \cdot L_{2-A} + 2 \cdot L_{2-B})$. Here, $L_{2-A}$: Length of a side in the X direction
$L_{2-B}$: Length of a side in the Y direction are defined. In other words, a length (current contribution length) in the first overlap region in which drive current necessary to drive the tunnel field-effect transistor is $L_{2-Total}$.

Additionally, when the entire planar shape including the first overlap region and the second overlap region is rectangular, the area $S_1$ including the entire first overlap region and the second overlap region is $(L_{1-A} \times L_{1-B})$. Here, $L_{1-A}$: Length of a side in the X direction
$L_{1-B}$: Length of a side in the Y direction are defined.

A parameter "KPI" is defined as follows. Note that $S_{gd}$ is the area where the orthographic projection image of the control electrode 20 and the first active region 30 overlaps with each other, in which the parasitic capacitance $C_{gd}$ between the control electrode 20 and the first active region 30 is defined, and $S_{gd}=S_1$ is satisfied in the tunnel field-effect transistor of Example 2.

$$KPI=S_{gd}/L_{2\text{-}Total}$$

Additionally, since basic operation of the semiconductor integrated circuit is to perform capacitance charge/discharge with drive current of the transistor, the smaller a KPI value is, the higher performance of the tunnel field-effect transistor is. Therefore, in a case where the value of $S_{gd}$ is constant, the larger the value of $L_{2\text{-}Total}$ is, the higher performance of the tunnel field-effect transistor is. For example, when a length of the first overlap region in the length direction of the control electrode 20 is 30 nm, a length of the second overlap region in the length direction of the control electrode 20 is 10 nm, and $L_{1-A}$=40 nm,
$L_{1-B}$=120 nm,
$L_{2-A}$=20 nm, and
$L_{2-B}$=100 nm are defined, $KPI_1$=(40×120)/(2×20+2×100)=20 is obtained. Assuming a structure in which the second-B active region extension portion 63 extends directly continuous from the second active region 50 without providing the second-A active region extension portion 62 in the tunnel field-effect transistor of Example 2, $KPI_2$=(40×120)/(2×30+100)=30 is obtained, the value becomes larger than $KPI_1$.

As described above, in the tunnel field-effect transistor of Example 2 illustrated in FIG. 3A, since the value of $L_{2\text{-}Total}$ can be made larger than that of Example and therefore, the tunnel field-effect transistor of Example 2 has more excellent performance than the tunnel field-effect transistor of Example 1 does, and power consumption can be further reduced.

Figure 3B:
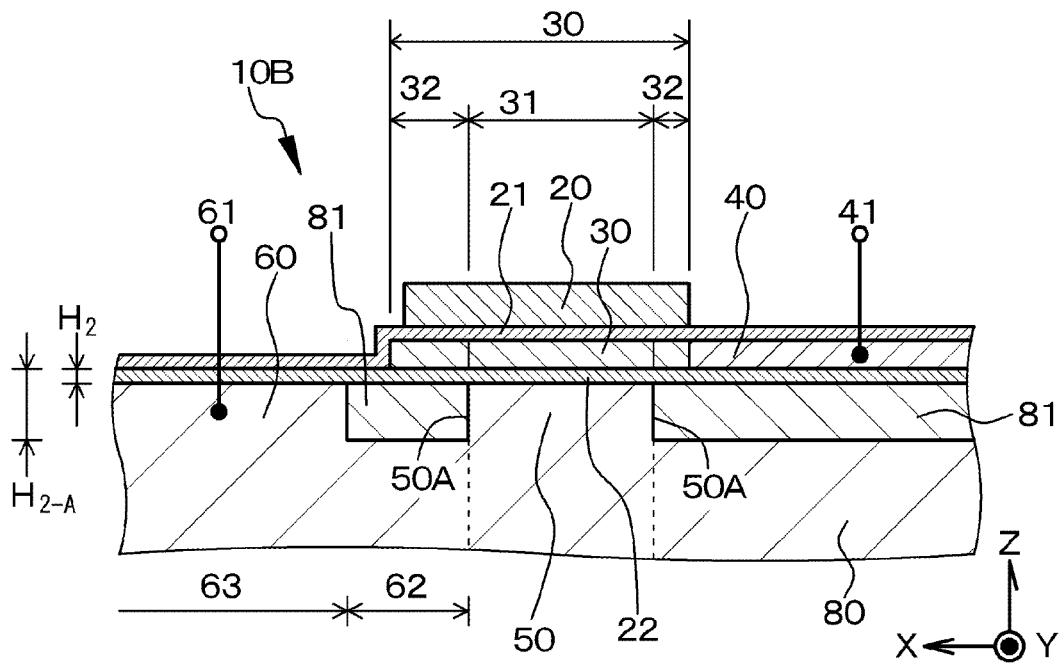
Figure 5A:
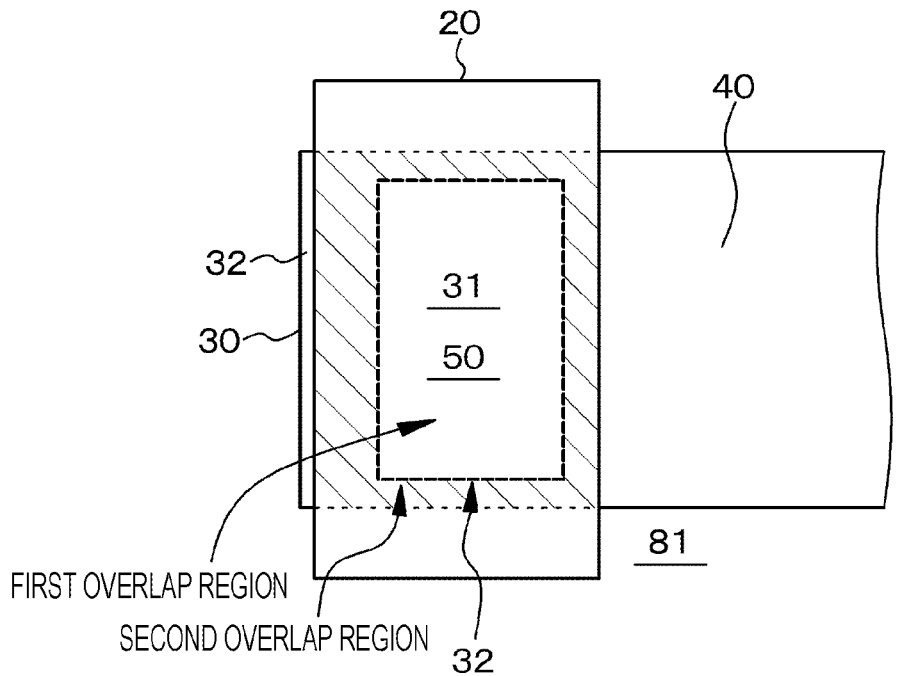
FIGS. 5A and 5B are respectively: a diagram schematically illustrating an arrangement relation between the control electrode, and the first active region and the first active region extension portion; and a diagram schematically illustrating an arrangement relation between the control electrode, and the second active region and the second active region extension portion in the modified example of the tunnel field-effect transistor of Example 2 illustrated in FIG. 3B.
Figure 5B:
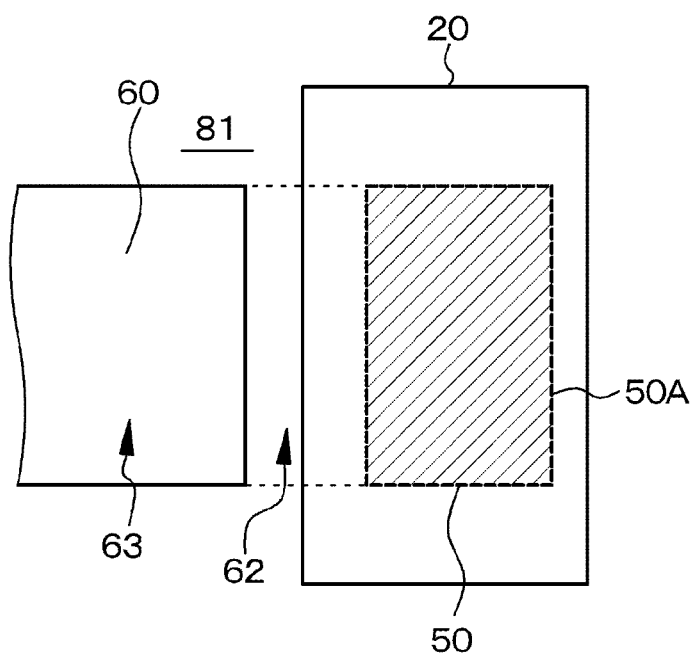

As FIG. 3B illustrates a schematic partial cross-sectional view, as FIG. 5A schematically illustrates an arrangement relation between the control electrode 20, and the first active region 30 and the first active region extension portion 40, and as FIG. 5B schematically illustrates a arrangement relation between the control electrode 20, and the second active region 50 and the second active region extension portion 60, the orthographic projection image of the control electrode 20 is included in the orthographic projection image of the first-B active region 32 in a modified example of the tunnel field-effect transistor of Example 2. Additionally, similarly to the one illustrated in FIG. 3A, the end portion of a part of the first-B active region 32 is located above the second-A active region extension portion 62.

EXAMPLE 3

Figure 6A:
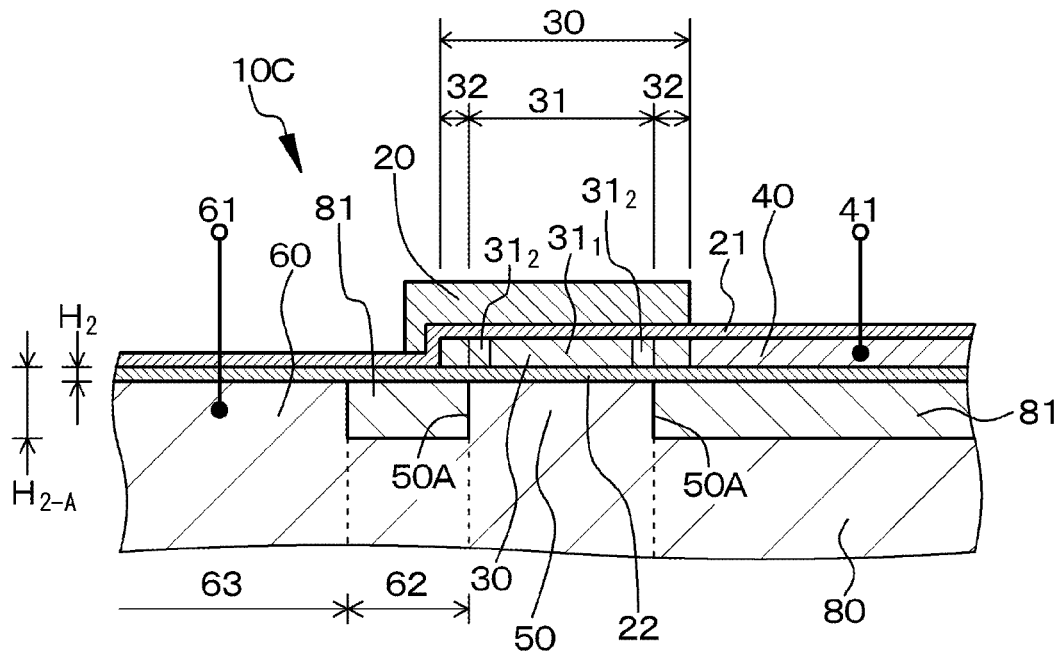
FIGS. 6A and 6B are schematic partial cross-sectional views illustrating a tunnel field-effect transistor of Example 3 and a modified example thereof, respectively.
Figure 6B:
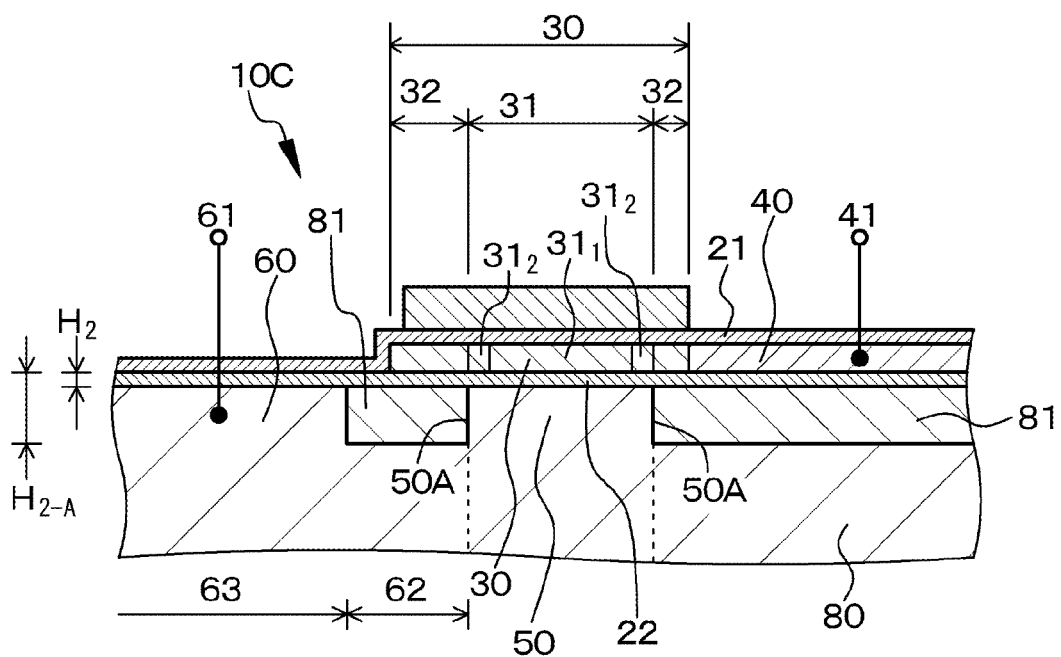
Figure 7A:
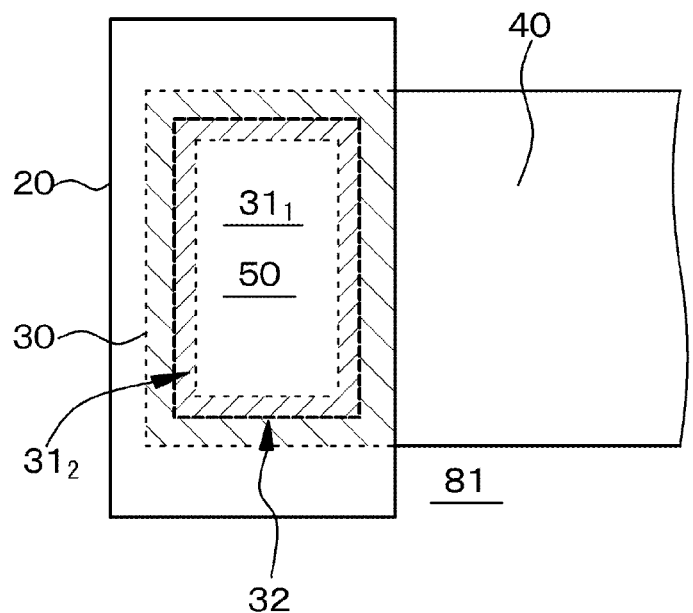
FIGS. 7A and 7B are respectively: a diagram schematically illustrating an arrangement relation between the control electrode, and the first active region and the first active region extension portion; and a diagram schematically illustrating an arrangement relation between the control electrode, and the second active region and the second active region extension portion in the tunnel field-effect transistor of Example 3 illustrated in FIG. 6A.
Figure 7B:
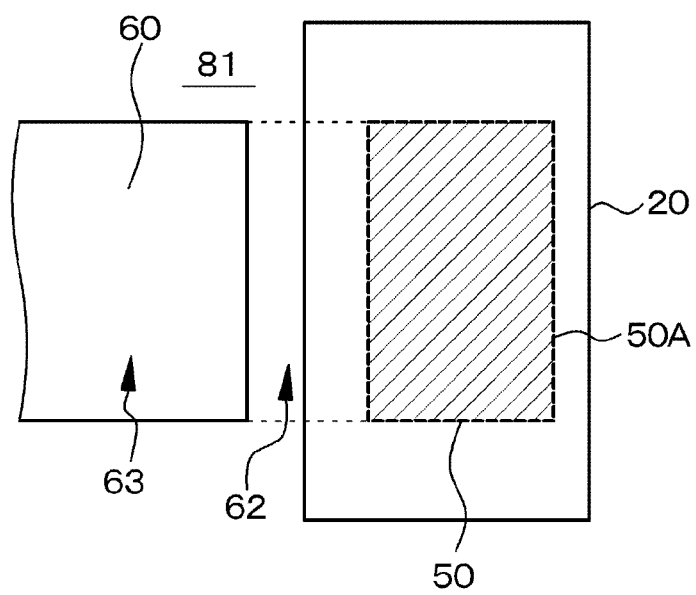
Figure 8A:
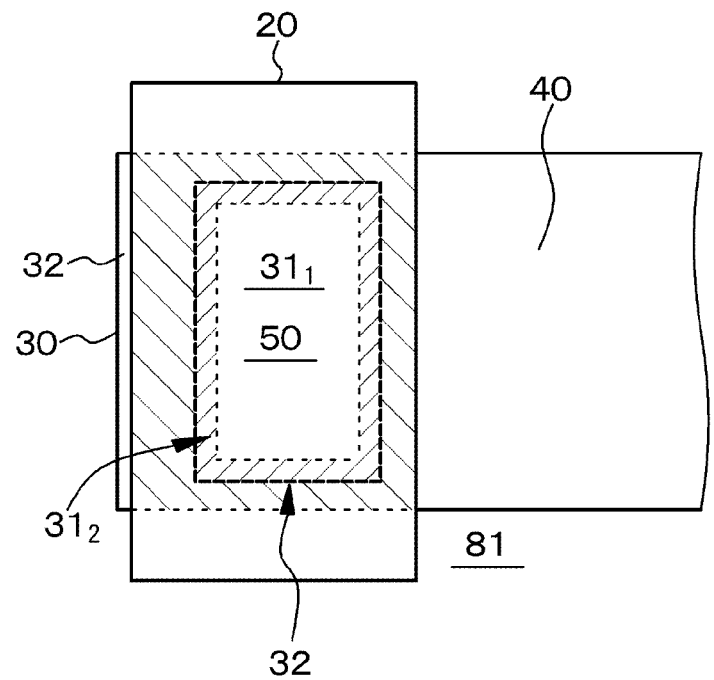
FIGS. 8A and 8B are respectively: a diagram schematically illustrating an arrangement relation between the control electrode, and the first active region and the first active region extension portion; and a diagram schematically illustrating an arrangement relation between the control electrode, and the second active region and the second active region extension portion in the modified example of the tunnel field-effect transistor of Example 3 illustrated in FIG. 6B.
Figure 8B:
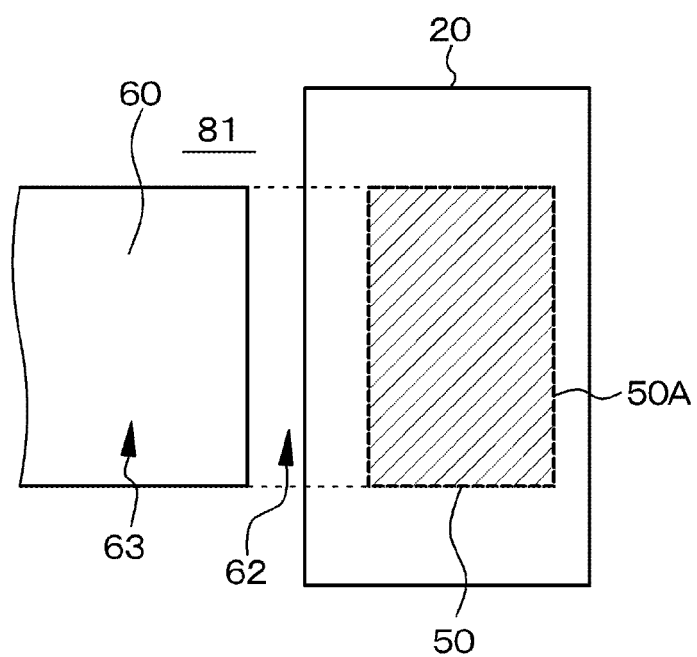

Example 3 is a modified example of Example 2. FIGS. 6A and 6B illustrate schematic partial cross-sectional views of a tunnel field-effect transistor of Example 3 and a modified example thereof, respectively. Additionally, FIG. 7A schematically illustrates an arrangement relation between the control electrode, and the first active region and the first active region extension portion, and FIG. 7B schematically illustrates an arrangement relation between the control electrode, and the second active region and the second active region extension portion in the tunnel field-effect transistor of Example 3 illustrated in FIG. 6A. Additionally, FIG. 8A schematically illustrates an arrangement relation between the control electrode, and the first active region and the first active region extension portion, and FIG. 8B schematically illustrates an arrangement relation between the control electrode, and the second active region and the second active region extension portion in the modified example of the tunnel field-effect transistor of Example 3 illustrated in FIG. 6B. In FIGS. 7A and 8A, the hatching lines directed from the upper right to the lower left are illustrated in order to clearly indicate a first-$A_2$ active region $32_2$.

In a tunnel field-effect transistor 10C of Example 3, the first-A active region 31 includes a first-$A_1$ active region $31_1$ and a first-$A_2$ active region $32_2$ surrounding the first-$A_1$ active region $31_1$, the first-$A_2$ active region $31_1$, the first-B active region 32, and the first active region extension portion 40 each have the characteristic as the first conductivity type, the second active region 50 has the characteristic as the second conductivity type, and the first-$A_1$ active region $31_1$ has an impurity concentration lower than an impurity concentration of the first-$A_2$ active region $31_2$. Here, the first-$A_1$ active region may have the characteristic as the first conductivity type, the characteristic as the second conductivity type, or the characteristic as intrinsic. The impurity concentration of the first-$A_1$ active region is 10% or less, preferably 5% or less, and more preferably 1% or less of the impurity concentration of the first-$A_2$ active region. Alternatively, it is desirable that the impurity concentration of the second region be $1 \times 10^{18}$ cm$^{-3}$ or less, preferably $1 \times 10^{16}$ cm$^{-3}$ or less, and more preferably $1 \times 10^{15}$ cm$^{-3}$ or less.

Since the first-A active region 31 has the configuration and the structure described above, in other words, since the first-$A_1$ active region $31_1$ includes, for example, the region having the characteristic as intrinsic or the characteristic as the first conductivity type or the second conductivity type having the low impurity concentration, the first active region 30 is easily depleted, and the voltage applied to the first electrode 41 is not transmitted to the first active region 30. As a result, electric charge hardly occurs in the first active region 30. This is similar to so-called fully depleted SOI (FD-SOI) transistor operation in the related art, and an amount of electric charges that is changed in the first active region 30 is reduced, in other words, electric charge/discharge is reduced, and power consumption can be further reduced as a result thereof.

Steps similar to [Step-100] to [Step-130] of Example 1 are executed in order to manufacture the above-described tunnel field-effect transistor. Note that substantially an entire region of the first active region 30 is set as a region having the characteristic as intrinsic or the characteristic as the first conductivity type or the second conductivity type having the low concentration. Next, the first active region extension Portion 40 to the first active region 30 are doped with a material of the first conductivity type by the solid phase diffusion method or the ion implantation method. Then, with this doping, the first-$A_2$ active region $31_1$, the first-B active region 32, and the first active region extension portion 40 are to be regions each having the characteristic as the first conductivity type, and the first-$A_1$ active region $31_1$ is to be a region having the characteristic as intrinsic or the characteristic as the first conductivity type or the second conductivity type having the low impurity concentration.

Needless to mention that the configurations and the structures of the first overlap region and the second overlap region described in the tunnel field-effect transistor of Example 1 can also be applied to the tunnel field-effect transistor of Example 3.

EXAMPLE 4

Figure 9A:
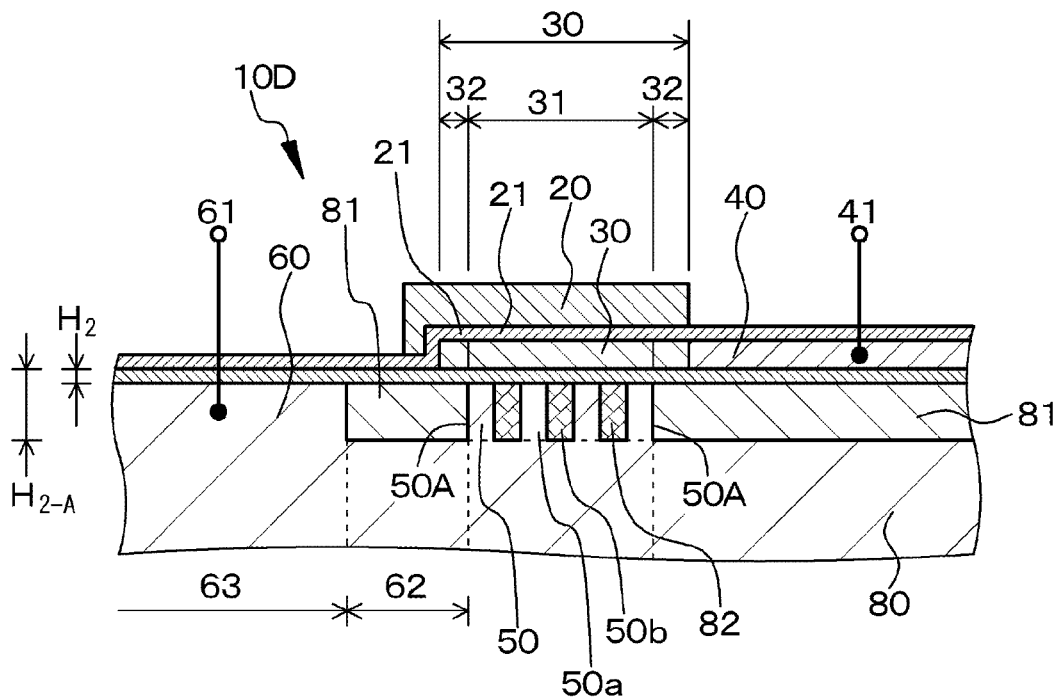
FIGS. 9A and 9B are respectively: a schematic partial cross-sectional view illustrating a tunnel field-effect transistor of Example 4; and a diagram schematically illustrating an arrangement relation between the control electrode, and the second active region and the second active region extension portion.
Figure 9B:
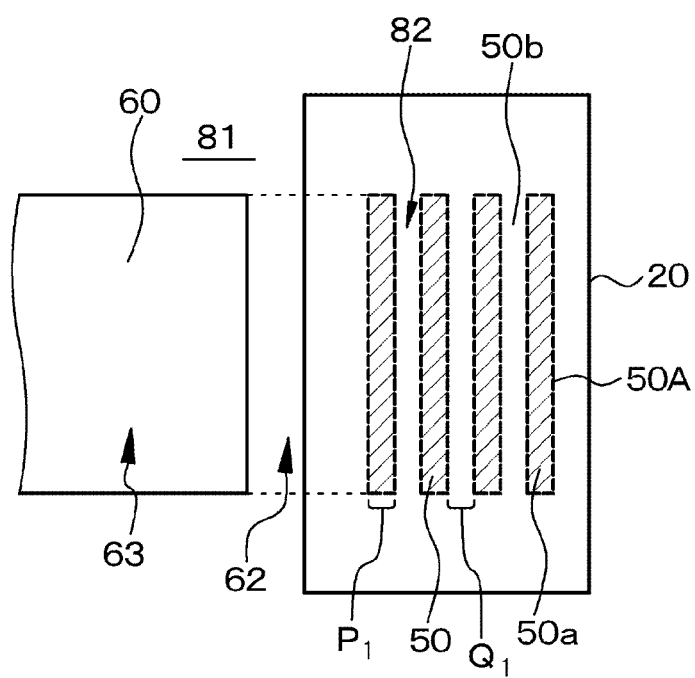

Example 4 is also a modified example of Example 2. FIGS. 9A and 9B illustrate: a schematic partial cross-sectional view of a tunnel field-effect transistor of Example 4; and an arrangement relation between the control electrode, and the second active region and the second active region extension portion.

In a tunnel field-effect transistor 10D of Example 4, the second active region 50 includes a plurality of protruding second active region segments 50a, and a recess 50b between a second active region segment 50a and a second active region segment 50a is embedded with an insulation material 82. Here, the insulation material 82 includes a material same as the insulation material constituting the insulation region 81.

Figure 18A:
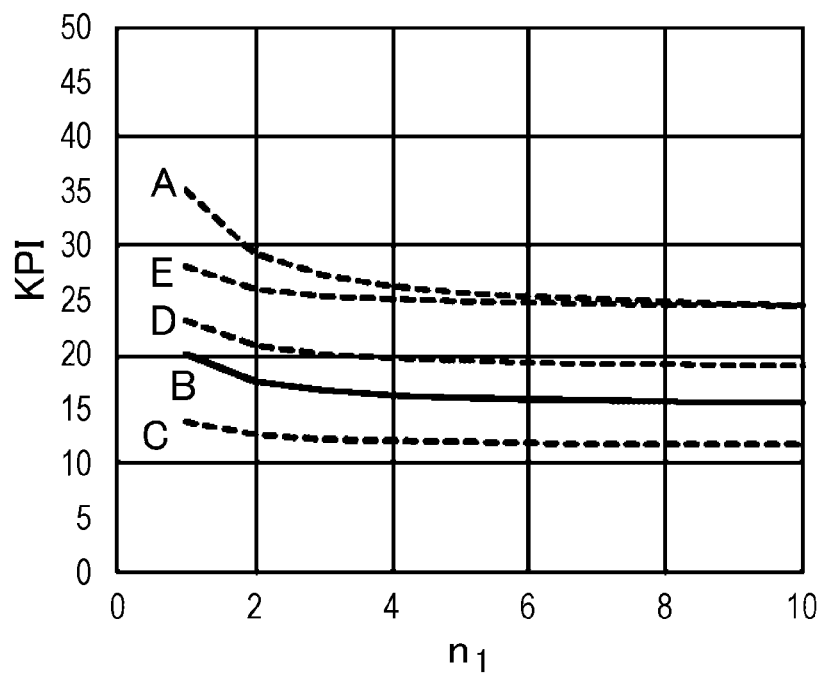
FIGS. 18A and 18B are graphs illustrating results in which relations between the number of second active region segments and parameter KPI values in the tunnel field-effect transistor of Example 4 and the modified example thereof are obtained, respectively.

A planar shape of each second active region segment 50a can be formed in a strip shape (see FIG. 9B). Here, FIG. 18A illustrates results of obtaining values of the parameter KPI in a case of defining $L_{1-B}$=120 nm, $L_{2-B}$=100 nm, and when a width of the strip shape second active region segment 50a is defined as $P_1$ (nm), a space between a strip shape second active region segment 50a and a second active region segment 50a (width of the recess 50b) is defined as $Q_1$ (nm), and the number of the strip shape second active region segments 50a is defined as $n_1$. Note that, in FIG. 18A, "A" represents a result of $P_1/Q_1$=20 nm/20 nm, "B" represents a result of $P_1/Q_1$=20 nm/10 nm, "C" represents a result of $P_1/Q_1$=20 nm/5 nm, "D" represents a result of $P_1/Q_1$=30 nm/10 nm, and "E" represents a result of $P_1/Q_1$=50 nm/10 nm. Thus, since the planar shape of each second active region segment 50a is formed in the strip shape, the total extension length $L_{2-Total}$ of the end portion of the second active region 50 can be increased, and as a result, the value of the parameter KPI can be reduced, and performance of the tunnel field-effect transistor can be further improved.

Figure 10:
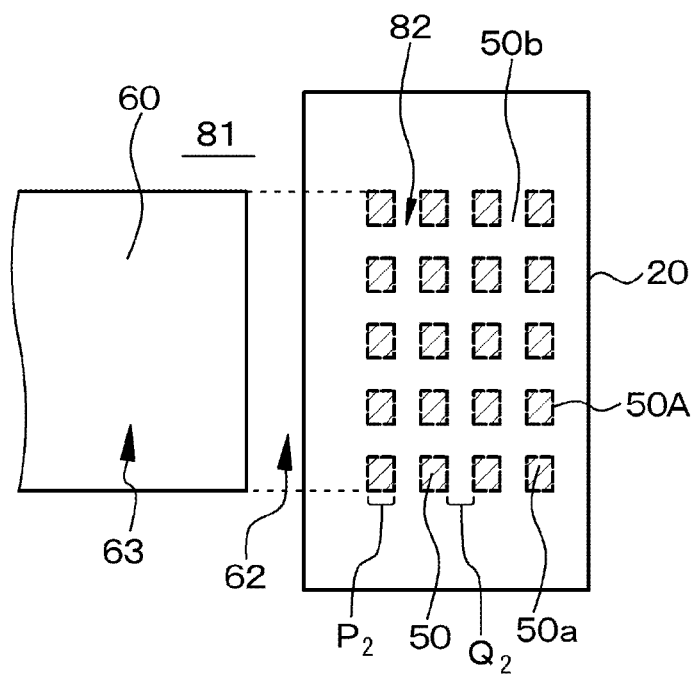
FIG. 10 is a diagram schematically illustrating an arrangement relation between the control electrode, and the second active region and the second active region extension portion in a modified example of the tunnel field-effect transistor of Example 4.

Alternatively, as FIG. 10 schematically illustrates an arrangement relation between the control electrode, and the second active region and the second active region extension portion in a modified example of the tunnel field-effect transistor of Example 4, the plurality of second active region segments 50a can be arrayed in a two-dimensional matrix shape. Note that the plurality of second active region segments 50a arrayed in the two-dimensional matrix shape may be arrayed regularly or not necessarily arrayed regularly. Additionally, an array direction may be regular or may be irregular.

Figure 18B:
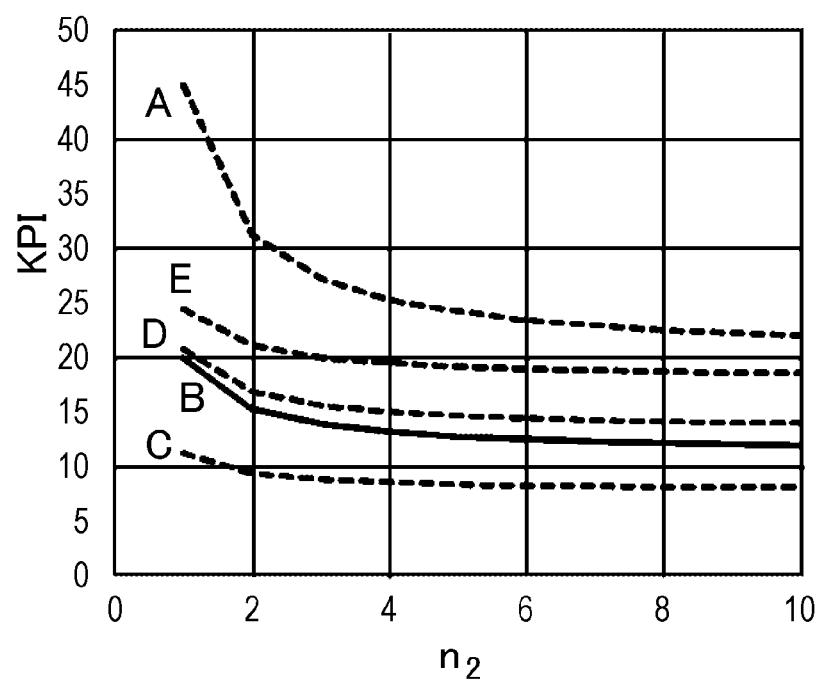

Here, FIG. 18B illustrates results of obtaining values of the parameter KPI in a case of defining $L_{1-B}$=120 nm $L_{2-B}$=100 nm, and when a length of one side of a second active region segment 50a having a square planar shape is defined as $P_2$ (nm), a space between a second active region segment 50a and a second active region segment 50a (width of the recess 50b) is defined as $Q_2$ (nm), and the number of the second active region segments 50a is defined as $n_2 \times n_2$. Note that, in FIG. 18B, "A" represents a result of $P_2/Q_2$=20 nm/20 nm, "B" represents a result of $P_2/Q_2$=20 nm/10 nm, "C" represents a result of $P_2/Q_2$=20 nm/5 nm, "D" represents a result of $P_2/Q_2$=30 nm/10 nm, and "E" represents a result of $P_2/Q_2$=50 nm/10 nm. Thus, since the planar shape of each second active region segment 50a has the rectangular shape, the total extension length $L_{2-Total}$ of the end portion of the second active region 50 can be increased, and as a result, the value of the parameter EPI can be reduced, and performance of the tunnel field-effect transistor can be further improved.

In the tunnel field-effect transistor of Example 4, the recess 50b is advisably formed at the time of forming the insulation region 81 having the shallow trench structure on the silicon semiconductor substrate 80 in [Step-100] of the manufacturing method of the tunnel field-effect transistor in Example 1 on the basis of a known method. Note that the plurality of protruding second active region segments 50a can be formed on the basis of a direct self-assembly technique.

Figure 11:
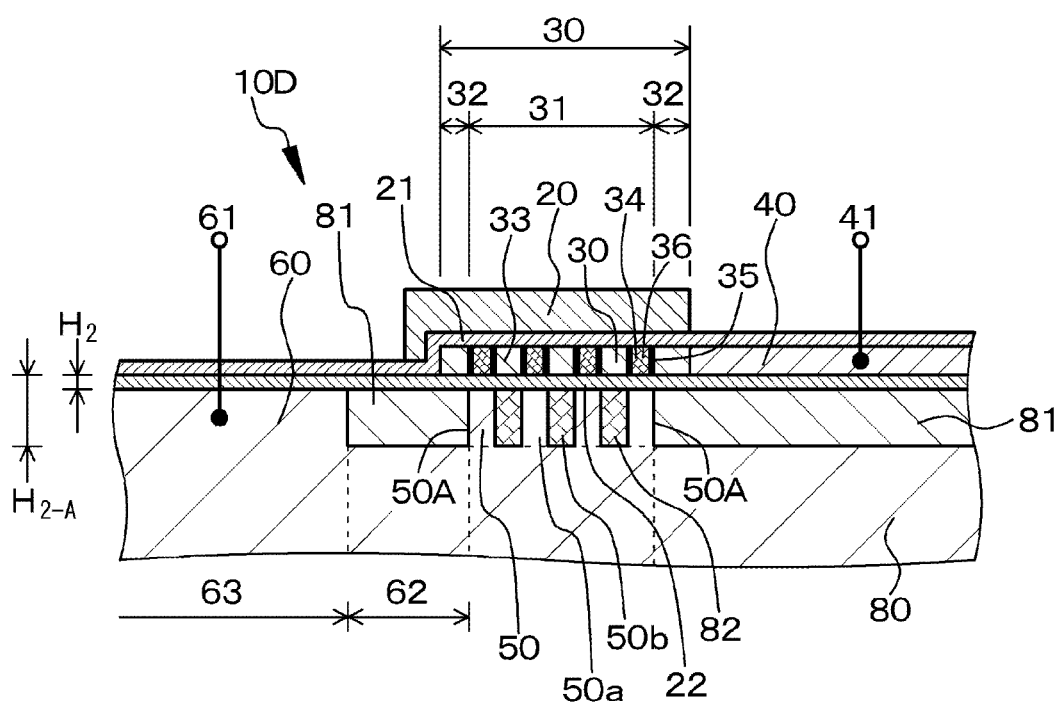
FIG. 11 is a schematic partial cross-sectional view of another modified example of the tunnel field-effect transistor of Example 4.

By the way, as FIG. 11 illustrates a schematic partial cross-sectional view of another modified example of the tunnel field-effect transistor of Example 4, a Portion 33 of the first active region 30 facing the recess 50b can have the characteristic as the first conductivity type. In other words, behavior as the n type is exhibited or the electron donating property is provided. On the other hand, the second active region 50 has the characteristic as the second conductivity type (specifically, the p type) similarly to Example 1. Furthermore, a portion 34 of the first active region 30 facing the second active region segment 50a includes a first region 35 having the characteristic as the first conductivity type, and a second region 36 surrounded by the first region 35 and having an impurity concentration lower than an impurity concentration of the first region 35. The second region 36 may have the characteristic as the first conductivity type, the characteristic as the second conductivity type, or the characteristic as intrinsic. The impurity concentration of the second region 36 is 10% or less, preferably 5% or less, and more preferably 1% or less of the impurity concentration of the first region 35. Alternatively, it is desirable that the impurity concentration of the second region be $1 \times 10^{18}$ cm$^{-3}$ or less, preferably $1 \times 10^{16}$ cm$^{-3}$ or less, and more preferably $1 \times 10^{15}$ cm$^{-3}$ or less. Since the first active region 30 has the configuration and the structure described above, in other words, the first active region 30 has, for example, the region 36 having the characteristic as intrinsic or the characteristic as the first conductivity type or the second conductivity type having the low impurity concentration. Consequently, the first active region 30 is easily depleted similarly to the tunnel field-effect transistor of Example 3, and voltage applied to the first electrode 41 is not transmitted to the first active region 30. As a result, electric charge hardly occurs in the first active region 30. This is similar to the so-called fully depleted SOI (FD-SOI) transistor operation in the related art like the tunnel field-effect transistor of Example 3, an amount of electric charge that is changed in the first active region 30 is reduced, in other words, electric charge/discharge is reduced, and power consumption can be further reduced as a result thereof.

Steps similar to [Step-100] to [Step-130] of Example 1 are executed in order to manufacture the above-described tunnel field-effect transistor. Note that substantially the entire region of the first active region 30 is set as the intrinsic type, or the first conductivity type or the second conductivity type having the low impurity concentration. Next, the first active region extension portion 40 to the first active region 30 are doped with the material of the first conductivity type by the solid phase diffusion method or the ion implantation method. Then, with this doping, the portion 33 of the first active region 30 is to be a region having the characteristic as the first conductivity type, and furthermore, the first-B active region 32 and the first region 35 are to be regions having the characteristic as the first conductivity type by the solid phase diffusion method.

Except for the above-described points, a detailed description will be omitted because the configurations and the structures of the tunnel field-effect transistor of Example 4 or the modified examples thereof can be similar to the structures and configurations of the tunnel field-effect transistor of Example 1.

Figure 12A:
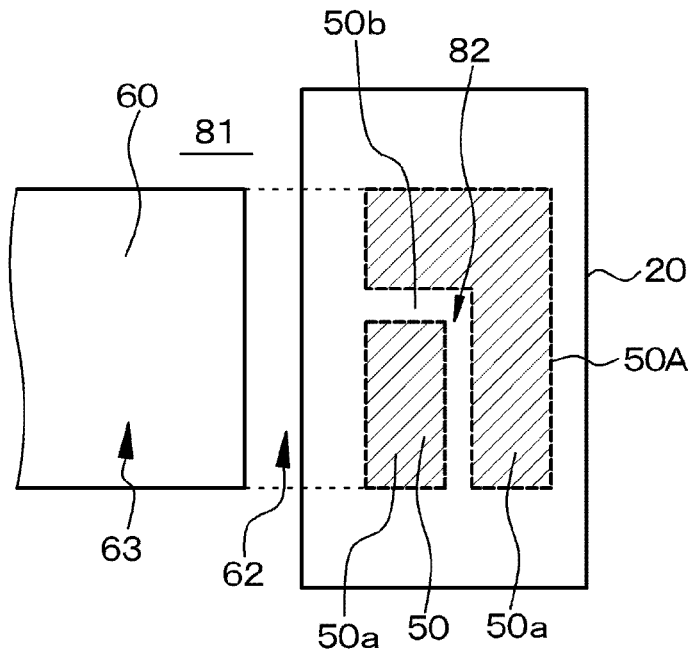
FIGS. 12A and 12B are diagrams schematically illustrating an arrangement relation between the control electrode, and the second active region and the second active region extension portion of still other modified examples of the tunnel field-effect transistor of Example 4.
Figure 12B:
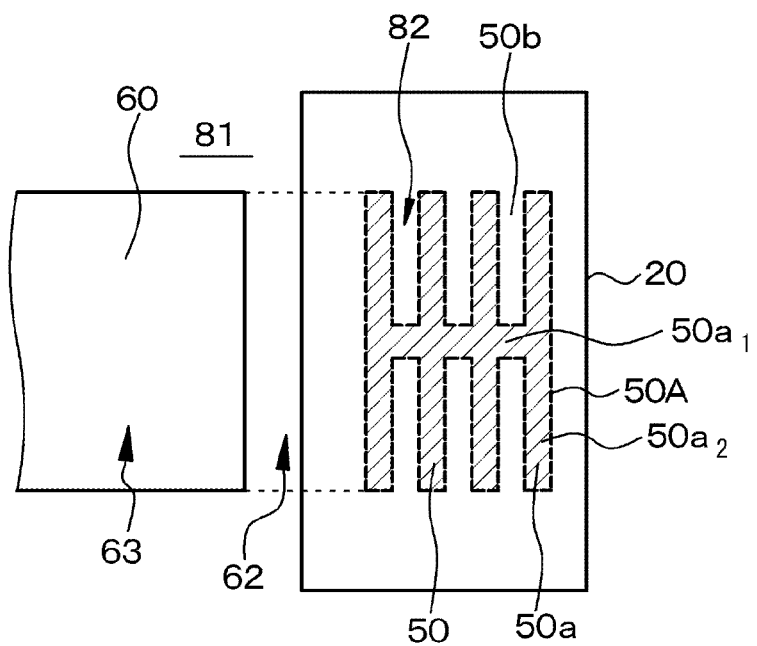

Additionally, FIGS. 12A and 12B schematically illustrate modified examples of the arrangement relation between the control electrode, and the second active region and the second active region extension portion. In the example illustrated in FIG. 12A, the second active region segments 50a includes a combination of: a second active region segment having a planar shape of "L" shape; and a second active region segment having a rectangular planar shape. In the example illustrated in FIG. 12B, the second active region segments 50a includes a combination of: a main strip portion $50a_1$ and branch strip portions $50a_2$ extending from the main strip portion $50a_1$.

Needless to mention that the configurations and the structures of the first overlap region and the second overlap region described in the tunnel field-effect transistor of Example 1 can be applied to the tunnel field-effect transistor of Example 4.

EXAMPLE 5

Figure 13A:
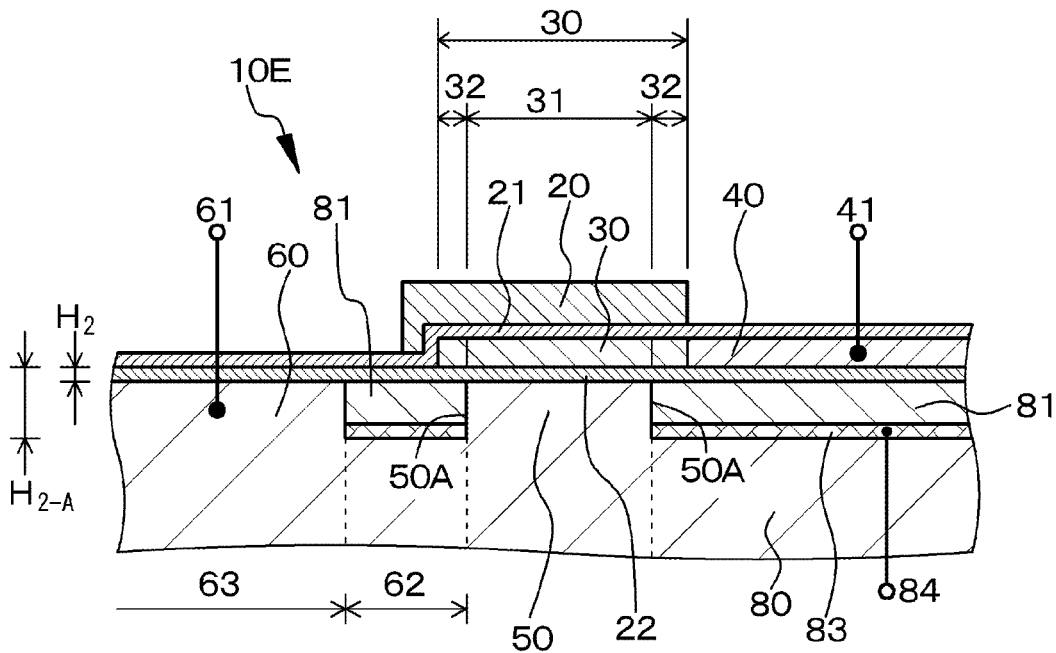
FIGS. 13A and 13B are schematic partial cross-sectional views of Example 5 and a modified example thereof, respectively.
Figure 13B:
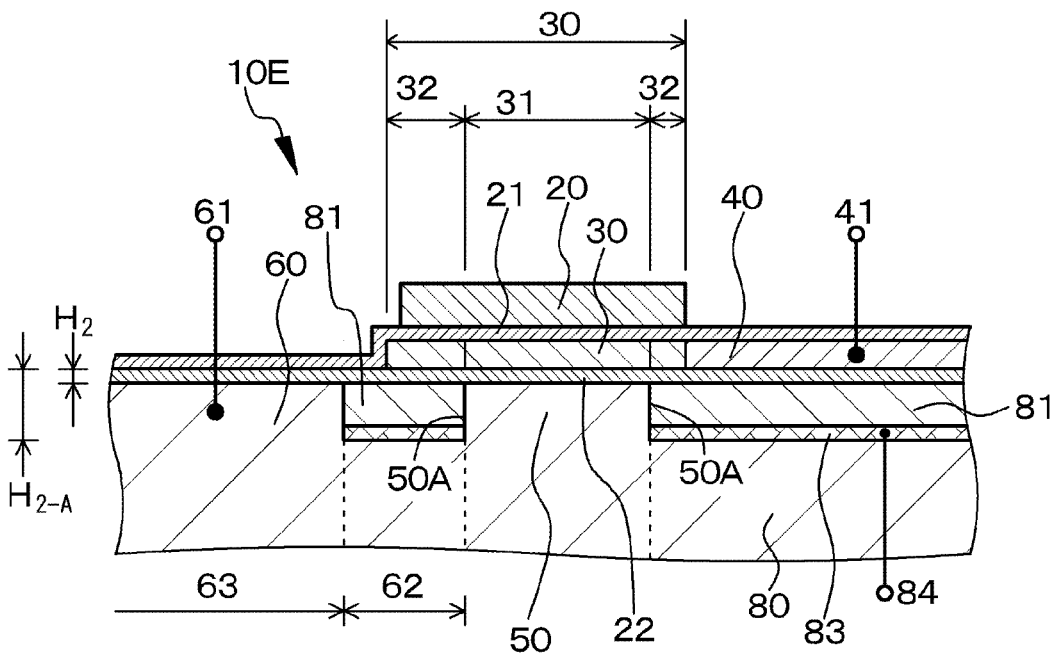

Example 5 is a modified example of Examples 1 to 4. As FIG. 13A or 13B schematically illustrate a partial cross-sectional view, a semiconductor layer 83 having the first conductivity type is formed below the first-B active region 32 in a tunnel field-effect transistor 10E of Example 5. Specifically, the insulation region 81 is located immediately under the first-B active region 32, and the semiconductor layer 83 having the first conductivity type is formed between the insulation region 81 and the silicon semiconductor substrate 80. The second active region 50 has the characteristic as the second conductivity type similarly to Examples 1 to 4. Additionally, voltage different from voltage applied to the second active region 50 is applied to the semiconductor layer 83 via a wire 84. Specifically, the voltage higher than the voltage applied to the second active region 50 is applied to the semiconductor layer 83.

Since Example 5 has the configuration and the structure described above, potential of the first-B active region 32 is controlled via the above-described second B capacitance to surely control conditions in order to make tunnel current flow in the end portion 50A of the second active region 50. Note that the configuration and the structure of the semiconductor layer 83 in Example 5 can be applied to the tunnel field-effect transistors in other Examples.

In the tunnel field-effect transistor of Example 5, the semiconductor layer 83 is to be formed at the time of forming the insulation region 81 having the shallow trench structure on the silicon semiconductor substrate 80 in [Step-100] of the manufacturing method of the tunnel field-effect transistor in Example 1 on the basis of a known method.

EXAMPLE 6

Figure 14A:
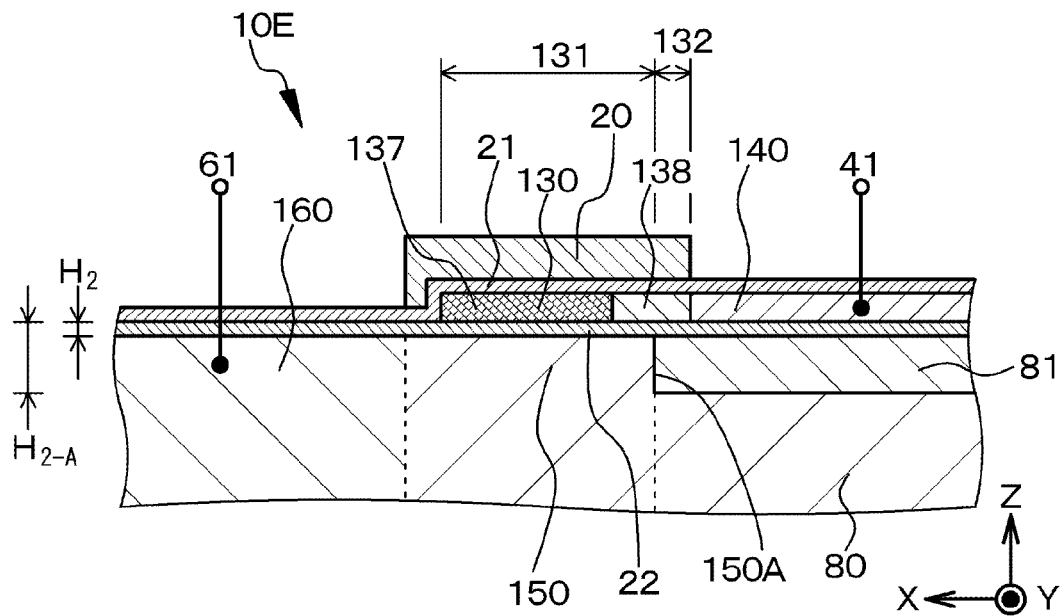
FIGS. 14A and 14B are schematic partial cross-sectional views of a tunnel field-effect transistor of Example 6 and a modified example thereof, respectively.
Figure 14B:
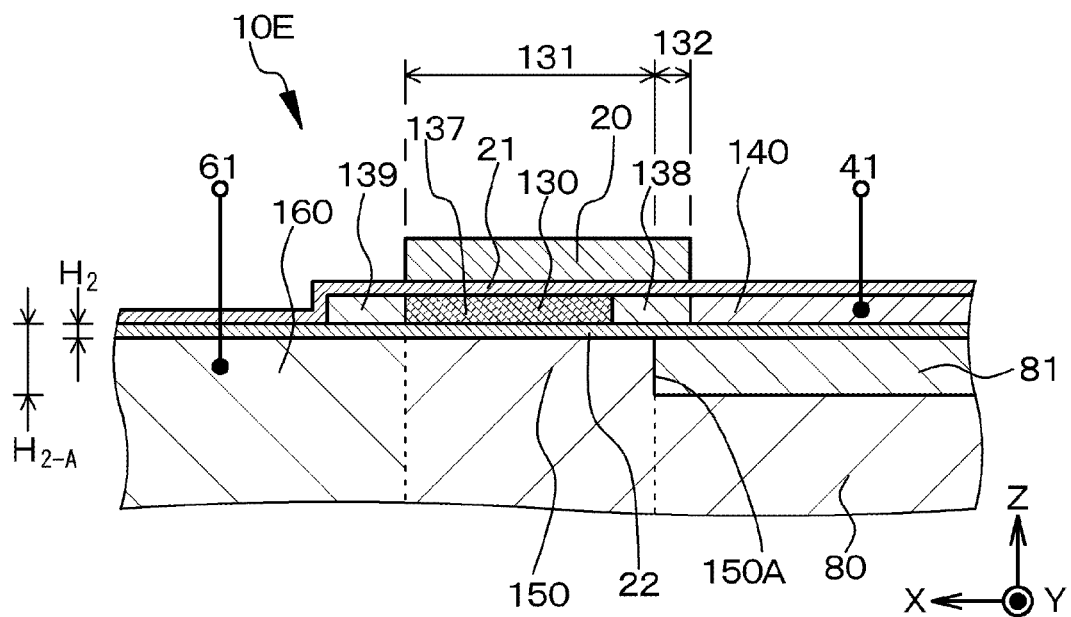
Figure 15A:
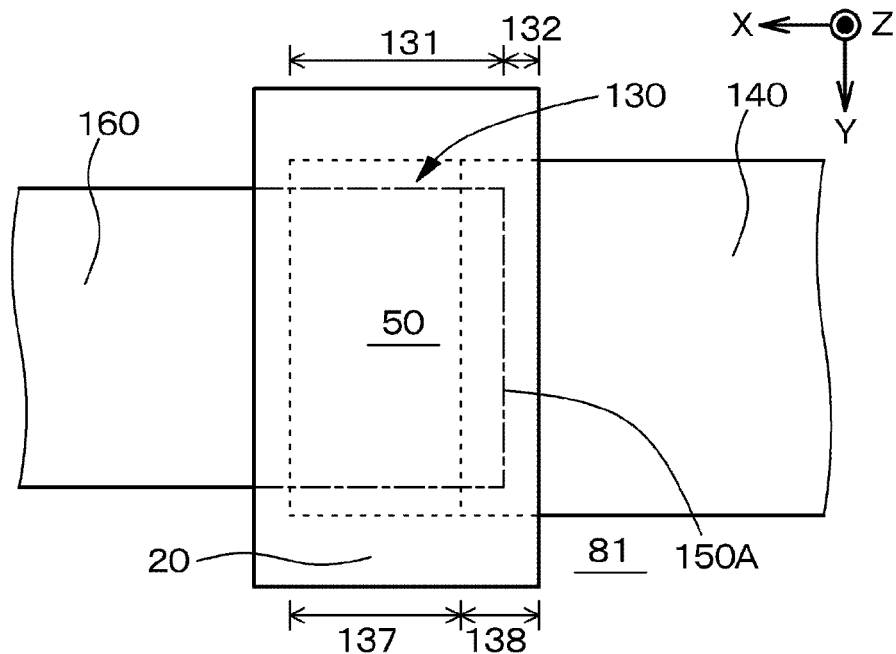
FIGS. 15A and 15B are diagrams each illustrating an arrangement relation between the control electrode, and the first active region, the first active region extension portion, the second active region, and the second active region extension portion in the tunnel field-effect transistor of Example 6 illustrated in FIGS. 14A and 14B.
Figure 15B:
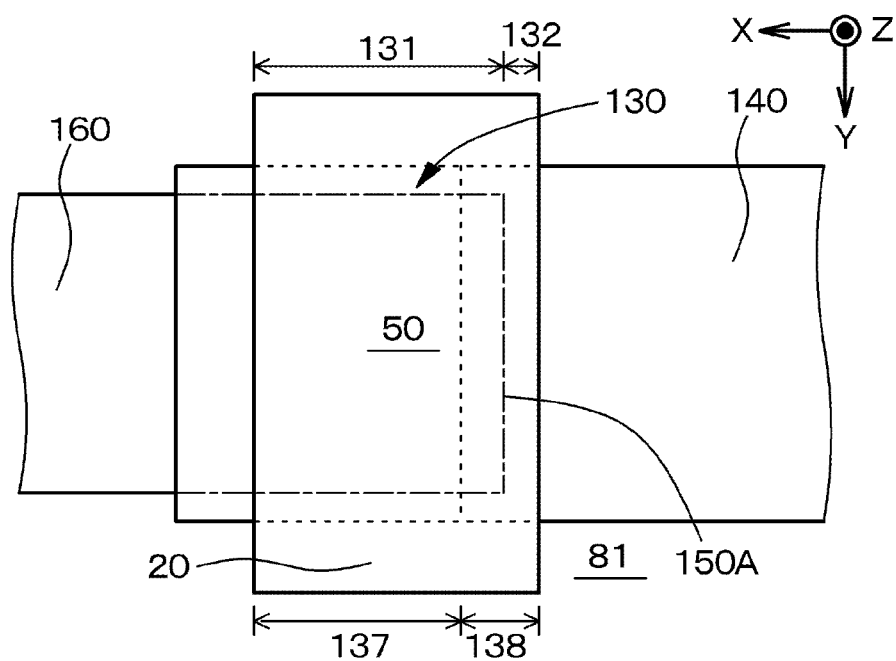

Example 6 relates to the tunnel field-effect transistor according to the second aspect of the present disclosure. FIGS. 14A and 14B are schematic partial cross-sectional views of a tunnel field-effect transistor of Example 6 and a modified example thereof, and FIGS. 15A and 15B schematically illustrate an arrangement relation between the control electrode and, the first active region, the first active region extension portion, the second active region, and the second active region extension portion in the tunnel field-effect transistor of Example 6.

A tunnel field-effect transistor 10F of Example 6 illustrated in FIGS. 14A and 14B includes:

a first active region 130;

a second active region 150 provided under the first active region 130;

the control electrode 20 provided on the first active region 130;

a first active region extension portion 140 extending from the first active region 130; and a second active region extension portion 160 extending from the second active region 150, when a portion of the first active region 130 where an orthographic projection image of the control electrode 20, an orthographic projection image of the first active region 130, and an orthographic projection image of the second active region 150 overlap with one another is defined as a first-a active region 131, and a portion of the first active region 130 where the orthographic projection image of the control electrode 20 and the orthographic projection image of the first active region 130 overlap with each other and do not overlap with the orthographic projection image of the second active region 150 is defined as a first-b active region 132, the first-b active region 132 has the characteristic as the first conductivity type and the second active region 150 has the characteristic as the second conductivity type different from the first conductivity type, an insulation region 81 is formed under the first-b active region 132 and under the first active region extension portion 140, and the first-a active region 131 includes a first-$a_1$ active region 137 and a first-$a_2$ active region 138 interposed between the first-$a_1$ active region 137 and the first-b active region 132, having the characteristic as the first conductivity type, and having an impurity concentration higher than an impurity concentration of the first-$a_1$ active region 137. The first active region extension portion 140 and the second active region extension portion 160 face each other interposing the control electrode 20.

Here, the first-$a_1$ active region 137 may have the characteristic as the first conductivity type, the characteristic as the second conductivity type, or the characteristic as intrinsic. An impurity concentration of the first-$a_1$ active region 137 is 10% or less, preferably 5% or less, and more preferably 1% or less of an impurity concentration of the first-$a_2$ active region 138. Alternatively, the impurity concentration of the first-$a_1$ active region 137 is $1\times10^{18}$ cm$^{-3}$ or less, preferably $1\times10^{16}$ cm$^{-3}$ or less, and more preferably $1\times10^{15}$ cm$^{-3}$ or less.

Note that, in the tunnel field-effect transistor of Example 6 illustrated in FIG. 14A, the orthographic projection image of the first active region 130 is included in the orthographic projection image of the control electrode 20. On the other hand, in the tunnel field-effect transistor of Example 6 illustrated in FIG. 14B, the orthographic projection image of the control electrode 20 is included in the orthographic projection image of the first active region 130. In this case, an extension region 139 of the first active region 130 extending on the second active region extension portion 160 has the characteristic as the second conductivity type.

Additionally, the second active region 150 is surrounded by the insulation region 81. Here, an insulation material constituting the insulation region 81 includes an insulation material having low permittivity, specifically, an insulation material similar to the insulation material described in Example 1. The insulation region 81 has the so-called shallow trench (STI) structure. The second active region extension portion 160 is also surrounded by the insulation region 81.

Furthermore, the first active region 130 and the first active region extension portion 140 each include a two-dimensional material or graphene, specifically, a two-dimensional material such as $MoS_2$ with a thickness of 1 nm. Additionally, the second active region 150 and the second active region extension portion 160 include the silicon semiconductor substrate 80 and have the second conductivity type (specifically, the p type). An insulation layer (first insulation layer 21) including hafnium oxide ($HfO_2$) with a thickness of 1 nm is formed between the control electrode 20 and the first active region 130, and the second insulation layer 22 including $HfO_2$ with a thickness of 1 nm is provided between the first active region 130 and the second active region 150. The control electrode 20 includes TiN, for example. An extending direction of the first active region 130 and the length direction of the control electrode 20 are parallel. Note that the second active region 150 and the second active region extension portion 160 may include an SOI substrate, a germanium substrate, and a silicon-germanium substrate. Additionally, the second active region 150 and the second active region extension portion 160 may each include a two-dimensional material or graphene similarly to the description in Example 1.

Furthermore, electrons are moved by a tunnel effect between the first active region 130 and the second active region 150 by applying voltage to each of the control electrode 20, the first active region extension portion 140, and the second active region extension portion 160, thereby bringing the tunnel field-effect transistor 10F into the conduction state. Specifically, $V_{dd}$ (>0 volts) is applied to each of the control electrode 20 and the first active region extension portion 140 to earth the second active region extension portion 160, for example.

As described above, since the insulation region is formed under the first-b active region in the tunnel field-effect transistor of Example 6, capacitance is generated between the first overlap region and the second overlap region in a manner similar to the first aspect, and tunnel easily flows in the end portion of the second active region. Additionally, since the first-a active region includes the first-$a_1$ active region having the characteristic as intrinsic or the characteristic as the first conductivity type or the second conductivity type having the low impurity concentration, and the first-$a_2$ active region having the characteristic as the first conductivity type, the first-$a_1$ active region is easily depleted, and parasitic capacitance can be reduced. Furthermore, since the first-b active region has the characteristic as the first conductivity type, there is a merit in which the first-$a_2$ active region, the first-b active region, and the first active region extension portion are connected as a region having the characteristic as the first conductivity type.

Hereinafter, an outline of a manufacturing method of the tunnel field-effect transistor of Example 6 will be described.

[Step-600]

First, the insulation region 81 having the shallow trench structure is formed in the n-type silicon semiconductor substrate 80 on the basis of the known method. Subsequently, a surface of a region of the silicon semiconductor substrate 80 surrounded by the insulation region 81 is set to the second conductivity type (specifically, p type) on the basis of the ion implantation method. Thus, the second active region 150 and the second active region extension portion 160 can be obtained.

[Step-610]

Next, the second insulation layer 22 is formed on the surface of the silicon semiconductor substrate 80 (specifically, on the surface of the silicon semiconductor substrate 80 and on the insulation region 81 in Example 6).

[Step-620]

Next, a two-dimensional material layer is formed on the second insulation layer 22 on the basis of the CVD method, and then the ion implantation is applied to the two-dimensional material layer, thereby forming the first active region 130 (the first-$a_1$ active region 137 and the first-$a_2$ active region 138) and the first-b active region 132, in some cases, the extension region 139 of the first active region 130. Subsequently, the first active region 130 and the first active region extension portion 140 can be obtained by performing patterning into a desired shape.

[Step-630]

After that, the first insulation layer 21 is formed on the entire surface. Then, the control electrode 20 is formed on the first insulation layer 21. Thus, the tunnel field-effect transistor of Example 6 having the configuration and the structure illustrated in FIG. 14A or 14B can be obtained.

[Step-640]

After that, an interlayer insulation layer formed on the entire surface, and the first electrode 41 and the second electrode 61 are to be formed on the first active region extension portion 140 and the second active region extension portion 160.

In some cases, the first active region 130 having the characteristic as intrinsic or the characteristic as the first conductivity type or the second conductivity type having the low impurity concentration may be formed in advance, and the control electrode 20 is further formed similarly to the description in Example 3 or Example 4, and then the first-$a_2$ active region 138 and the first-b active region 132, in some cases, the extension region 139 of the first active region 130 may be formed by the solid phase diffusion method or the ion implantation method.

In the tunnel field-effect transistor of Example 6, first A capacitance is formed by the control electrode 20, the first insulation layer 21, and the first-$a_2$ active region 138, and first B capacitance is formed by the first-$a_2$ active region 138, the second insulation layer 22, and the second active region 150. On the other hand, second A capacitance is formed by the control electrode 20, the first insulation layer 21, and the first-b active region 132, and second B capacitance is formed by the first-b active region 132, the insulation region 81, and the p-type region of the silicon semiconductor substrate 80 immediately under the insulation region 81. Here, total capacitance in a region including the first-b active region 132 (capacitance based on the second A capacitance and the second B capacitance) has a value lower than total capacitance in a region including the first-$a_2$ active region 138 (capacitance based on the first A capacitance and the first B capacitance). Therefore, for example, even when $V_{dd}$ (>0 volts) is applied to the first active region extension portion 140 from a state where 0 volts is applied to each of the control electrode 20, the first active region 130, and the second active region 150, the second B capacitance is small in the region including the first-b active region 132, capacitive coupling with the control electrode by the second A capacitance is strong, and potential change is little. As a result, there is no change in the region including the first-$a_2$ active region 138. Subsequently, when $V_{dd}$ (>0 volts) is applied to the control electrode 20, potential in the region including the first-b active region 132 is further changed, and at the same time, potential in the region including the first-a$_2$ active region 138 is also changed. Then, as a result of the above, the tunnel current starts flowing, but the tunnel current starts flowing in the end portion 150A of the second active region 150 earlier than a remaining portion of the second active region 150. After that, the tunnel current flowing between the first active region 130 and the second active region 150 continues flowing exclusively between the end portion 150A of the second active region 150 and the first active region 130. On the other hand, since the first-a$_1$ active region 137 has the characteristic as intrinsic or the characteristic as the first conductivity type or the second conductivity type having the low impurity concentration, a region including the first-a$_1$ active region 137 is depleted and hardly influenced even by voltage application to the first active region extension portion 140 and the control electrode 20. Therefore, since electric charge/discharge hardly occurs in the first-a$_1$ active region 137, the capacitance seems effectively small, and this contributes to low power consumption.

While the tunnel field-effect transistor of the present disclosure has been described on the basis of preferable Examples, the tunnel field-effect transistor of the present disclosure is not limited to such Examples. The configurations, structures, constituent materials, manufacturing methods, and the like of the tunnel field-effect transistor described in Examples are illustrative and can be modified as appropriate. In Examples, it is assumed that the tunnel field-effect transistor solely corresponds to the n-channel type FET, but can also correspond to a p-channel type FET.

In some cases, the tunnel current flowing between the first active region 30 and the second active region 50 can be controlled by applying bias voltage to the second active region 50.

Figure 16A:
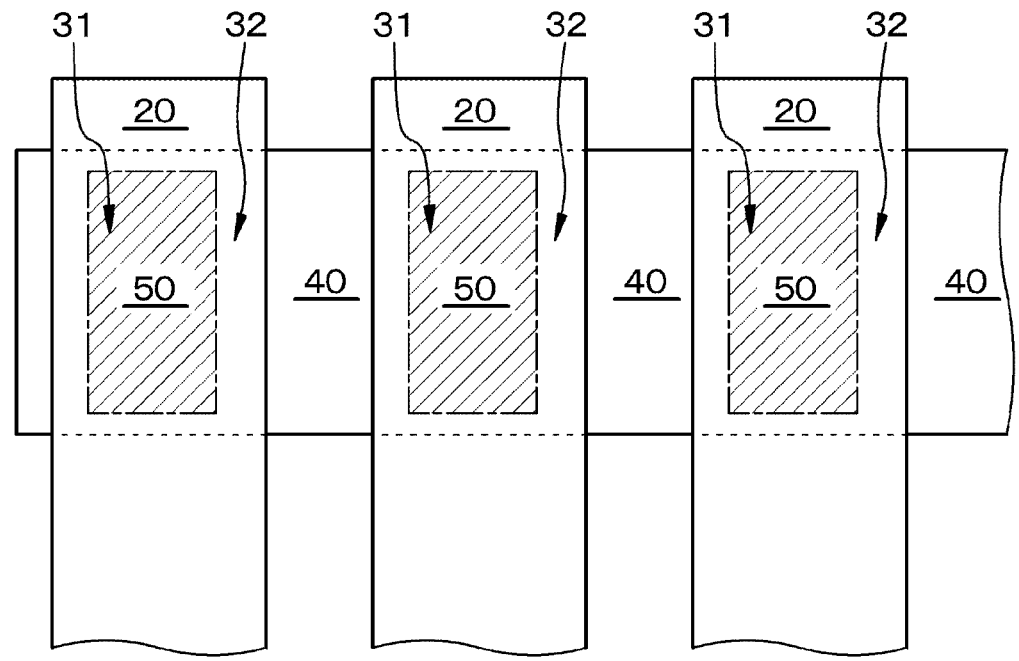
FIGS. 16A and 16B are respectively: a diagram illustrating an arrangement relation between the control electrode, and the second active region and the second active region extension portion; and a schematic partial cross-sectional view of still another modified example of the tunnel field-effect transistor of Example 2.
Figure 16B:
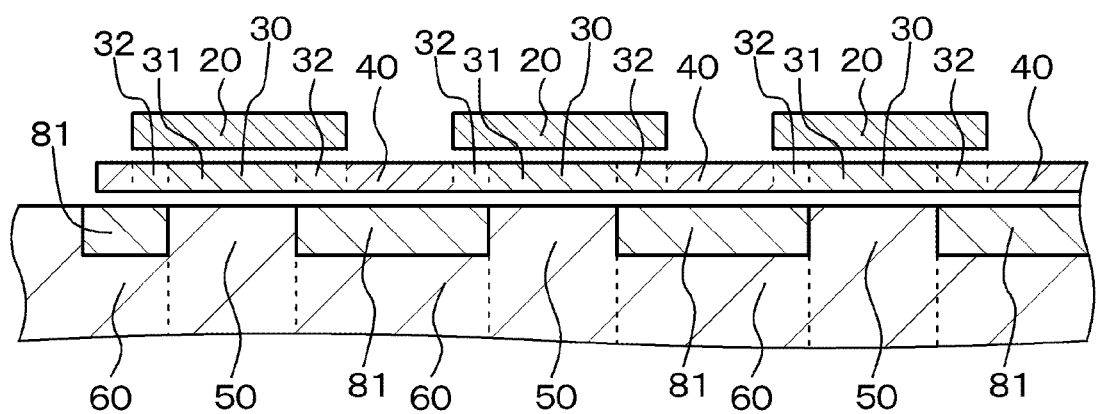
Figure 17:
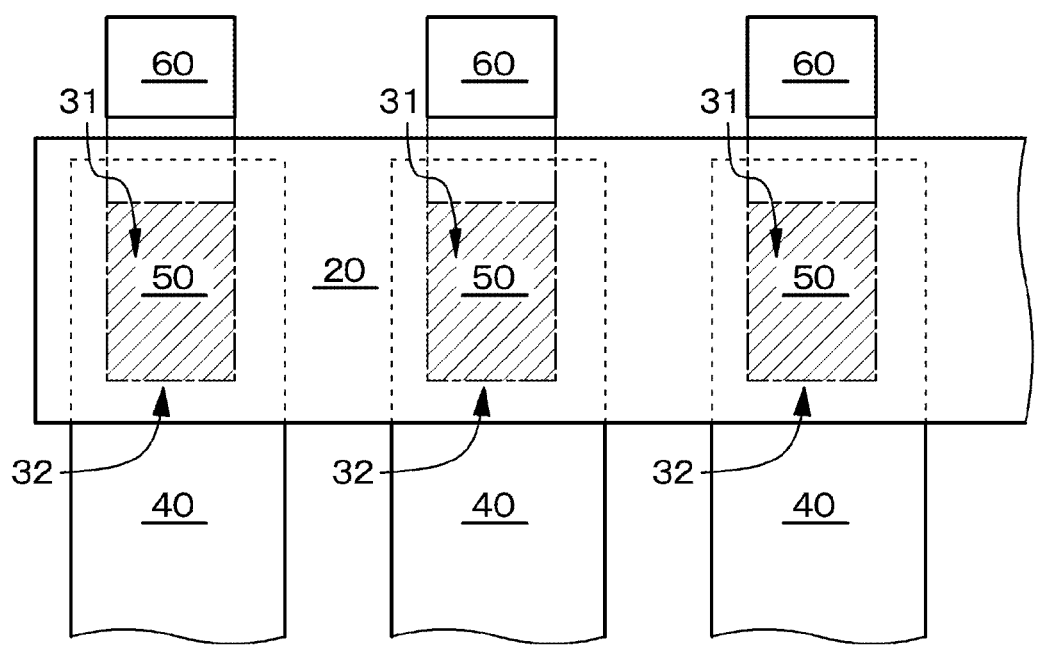
FIG. 17 is a diagram schematically illustrating an arrangement relation between the control electrode, and the second active region and the second active region extension portion in still another modified example of the tunnel field-effect transistor of Example 2.

Additionally, as FIG. 16A schematically illustrates an arrangement relation between the control electrode, and the second active region and the second active region extension portion of another modified example of the tunnel field-effect transistor of Example 2, and as FIG. 16B schematically illustrates a partial cross-sectional view, the control electrode 20 includes, for example, three segments, and the first active region 30, the first active region extension portion 40, the second active region 50, and the second active region extension portion 60 which are common in each of these segments of the control electrode 20 may be provided. Alternatively, as FIG. 17 schematically illustrates an arrangement relation between the control electrode, and the second active region the second active region extension portion in still another modified example of the tunnel field-effect transistor of Example 2, for example, each of the first active region 30, the first active region extension portion 40, the second active region 50, and the second active region extension portion 60 includes, for example, three segments, and the control electrode 20 common among these segments of each of the first active region 30, the first active region extension portion 40, the second active region 50, and the second active region extension portion 60 may be provided. An efficient layout can be achieved by adopting these configurations and sharing the control electrode or the first active region among a plurality of tunnel field-effect transistors.

Note that the present disclosure can also adopt the following configurations.

[A01] <Tunnel Field-Effect Transistor: First Aspect>
A tunnel field-effect transistor including:
a first active region;
a second active region provided under the first active region;
a control electrode provided on the first active region;
a first active region extension portion extending from the first active region; and
a second active region extension portion extending from the second active region,
in which the first active region includes a first-A active region and a first-B active region located at least between the first-A active region and the first active region extension portion,
an orthographic projection image of the control electrode and an orthographic projection image of the first active region at least partly overlap with each other,
the second active region exists below the first-A active region,
the second active region does not exist below the first-B active region, and
$L_{1-Y} < L_{2-Total}$ is satisfied in a case where: a total extension length of an end portion of a portion of the second active region where an orthographic projection image of the second active region overlaps with the orthographic projection image of the first active region is defined $L_{2-Total}$; and
a length in a Y direction of the first active region overlapping with the orthographic projection image of the second active region is defined as $L_{1-Y}$ when a direction extending from the first active region to the first active region extension portion is defined as a X direction and a stacked direction of the second active region, the first active region, and the control electrode is defined as a Z direction.

[A02] The tunnel field-effect transistor recited in [A01], in which
the second active region is surrounded by an insulation region, and
the first-B active region is formed on the insulation region.

[A03] The tunnel field-effect transistor recited in [A02], in which an insulation material constituting the insulation region includes an insulation material having low permittivity.

[A04] The tunnel field-effect transistor recited in any one of [A01] to [A03], in which
the first-A active region is surrounded by the first-B active region,
the second active region extension portion includes a second-A active region extension portion contacting the second active region and having an orthographic projection image overlapping with a part of an orthographic projection image of the first-B active region, and a second-B active region extension portion extending from the second-A active region extension portion, and
a distance in the Z direction between the second-A active region extension portion and the first active region is longer than a distance in the Z direction between the second active region and the first active region.

[A05] The tunnel field-effect transistor recited in [A04], in which an end portion of a part of the first-B active region is located above the second-A active region extension portion.

[A06] The tunnel field-effect transistor recited in [A04] or [A05], in which
the first-A active region includes a first-A$_1$ active region and a first-A$_2$ active region surrounding the first-A$_1$ active region,
the first-A$_2$ active region, the first-B active region, and the first active region extension portion each have a characteristic as a first conductivity type,
the second active region has a characteristic as a second conductivity type different from the first conductivity type, and the first-$A_1$ active region has an impurity concentration lower than an impurity concentration of the first-$A_2$ active region.

[A07] The tunnel field-effect transistor recited in any one of [A01] to [A05], in which the second active region includes a plurality of protruding second active region segments, and a recess between a second active region segment and a second active region segment is embedded with an insulation material.

[A08] The tunnel field-effect transistor recited in [A07], in which a planar shape of each of the second active region segments has a strip shape.

[A09] The tunnel field-effect transistor recited in [A07], in which the plurality of second active region segments is arrayed in a two-dimensional matrix shape.

[A10] The tunnel field-effect transistor recited in any one of [A07] to [A09], in which a portion of the first active region facing the recess has the characteristic as the first conductivity type, the second active region has the characteristic as the second conductivity type different from the first conductivity type, and a portion of the first active region facing the second active region segment includes a first region having the characteristic as the first conductivity type, and a second region surrounded by the first region and having an impurity concentration lower than an impurity concentration of the first region.

[A11] The tunnel field-effect transistor recited in any one of [A01] to [A10], in which a semiconductor layer having the first conductivity type is formed below the first-B active region, and the second active region has the second conductivity type different from the first conductivity type.

[A12] The tunnel field-effect transistor recited in [A11], in which voltage different from voltage applied to the second active region is applied to the semiconductor layer.

[A13] The tunnel field-effect transistor recited in any one of [A01] to [A12], in which the first active region and the first active region extension portion each include a two-dimensional material or graphene.

[A14] The tunnel field-effect transistor recited in any one of [A01] to [A13], in which the second active region and the second active region extension portion each include a silicon semiconductor substrate, a germanium substrate, or a silicon-germanium substrate.

[A15] The tunnel field-effect transistor recited in any one of [A01] to [A13], in which the second active region and the second active region extension portion each include a two-dimensional material or graphene.

[A16] The tunnel field-effect transistor recited in any one of [A01] to [A15], in which an extending direction of the first active region and a length direction of the control electrode are parallel.

[A17] The tunnel field-effect transistor recited in any one of [A01] to [A16], in which an insulation layer is formed between the control electrode and the first active region.

[A18] The tunnel field-effect transistor recited in any one of [A01] to [A17], in which a second insulation layer is provided between the first active region and the second active region.

[A19] The tunnel field-effect transistor recited in any one of [A01] to [A18], in which electrons are moved between the first active region and the second active region due to a tunnel effect by applying voltage to each of the control electrode, the first active region extension portion, and the second active region extension portion, and a conduction state can be achieved by such movement of the electrons.

[B01] <Tunnel Field-Effect Transistor: Second Aspect>

A tunnel field-effect transistor including:

a first active region;

a second active region provided under the first active region;

a control electrode provided on the first active region;

a first active region extension portion extending from the first active region; and a second active region extension portion extending from the second active region, in which when a portion of the first active region where an orthographic projection image of the control electrode, an orthographic projection image of the first active region, and an orthographic projection image of the second active region overlap with one another is defined as a first-a active region, a portion of the first active region where the orthographic projection image of the control electrode and the orthographic projection image of the first active region overlap with each other and do not overlap with the orthographic projection image of the second active region is defined as a first-b active region, the first-b active region has a characteristic as a first conductivity type, and the second active region has a characteristic as a second conductivity type different from the first conductivity type, an insulation region is formed below the first-b active region and below the first active region extension portion, and the first-a active region includes a first-$a_1$ active region and a first-$a_2$ active region interposed between the first-$a_1$ active region and the first-b active region, having the characteristic as the first conductivity type, and having an impurity concentration higher than an impurity concentration of the first-$a_1$ active region.

[B02] The tunnel field-effect transistor recited in [B01], in which the first active region and the first active region extension portion each include a two-dimensional material or graphene.

[B03] The tunnel field-effect transistor recited in [B01] or [B02], in which the second active region and the second active region extension portion each include a silicon semiconductor substrate, a germanium substrate, or a silicon-germanium substrate.

[B04] The tunnel field-effect transistor recited in [B01] or [B02], in which the second active region and the second active region extension portion each include a two-dimensional material or graphene.

[B05] The tunnel field-effect transistor recited in any one of [B01] to [B04], in which an extending direction of the first active region and a length direction of the control electrode are parallel.

[B06] The tunnel field-effect transistor recited in any one of [B01] to [B05], in which an insulation layer is formed between the control electrode and the first active region.

[B07] The tunnel field-effect transistor recited in any one of [B01] to [B06], in which a second insulation layer is provided between the first active region and the second active region.

[B08] The tunnel field-effect transistor recited in any one of [B01] to [B07], in which electrons are moved between the first active region and the second active region due to a tunnel effect by applying voltage to each of the control electrode, the first active region extension portion, and the second active region extension portion, and a conduction state can be achieved by such movement of the electrons.

REFERENCE SIGNS LIST 10A, 10B, 10C, 10D, 10E, 10F Tunnel field-effect transistor
20 Control electrode
21 Insulation layer (first insulation layer)
22 Second insulation layer
30, 130 First active region
31 First-A active region
131 First-a active region
132 First-b active region
32 First-B active region
33 Portion of first active region facing recess
34 Portion of first active region facing second active region segment
35 First region
36 Second region
137 First-$a_1$ active region
138 First-$a_2$ active region
139 Extension region of first active region
40, 140 First active region extension portion
41 First electrode
50, 150 Second active region
50A End portion of second active region
50a Second active region segment
50$a_1$ Main strip portion
50$a_2$ Branch strip portion
50b Recess
60, 160 Second active region extension portion
61 Second Electrode
62 Second-A active region extension portion
63 Second-B active region extension portion
81 Insulation region
82 Insulation material
83 Semiconductor layer
84 Wire

What is claimed is:

1. A tunnel field-effect transistor comprising:
a first active region;
a second active region provided under the first active region;
a control electrode provided on the first active region;
a first active region extension portion extending from the first active region; and
a second active region extension portion extending from the second active region,
wherein the first active region includes a first-A active region and a first-B active region located at least between the first-A active region and the first active region extension portion,
an orthographic projection image of the control electrode and an orthographic projection image of the first active region at least partly overlap with each other,
the second active region exists below the first-A active region,
the second active region does not exist below the first-B active region, and $L_{1-Y} < L_{2-Total}$ is satisfied in a case where:
a total extension length of an end portion of a portion of the second active region where an orthographic projection image of the second active region overlaps with the orthographic projection image of the first active region is defined as $L_{2-Total}$; and
a length in a Y direction of the first active region overlapping with the orthographic projection image of the second active region is defined as $L_{1-Y}$ when a direction extending from the first active region to the first active region extension portion is defined as an X direction and a stacked direction of the second active region, the first active region, and the control electrode is defined as a Z direction,
a semiconductor layer having a first conductivity type is formed below the first-B active region, and
the second active region has a second conductivity type different from the first conductivity type.

2. The tunnel field-effect transistor according to claim 1, wherein
the second active region is surrounded by an insulation region, and
the first-B active region is formed on the insulation region.

3. The tunnel field-effect transistor according to claim 2, wherein an insulation material constituting the insulation region includes an insulation material having low permittivity.

4. The tunnel field-effect transistor according to claim 1, wherein
the first-A active region is surrounded by the first-B active region,
the second active region extension portion includes a second-A active region extension portion contacting the second active region and having an orthographic projection image overlapping with a part of an orthographic projection image of the first-B active region, and a second-B active region extension portion extending from the second-A active region extension portion, and
a distance in the Z direction between the second-A active region extension portion and the first active region is longer than a distance in the Z direction between the second active region and the first active region.

5. The tunnel field-effect transistor according to claim 4, wherein an end portion of a part of the first-B active region is located above the second-A active region extension portion.

6. The tunnel field-effect transistor according to claim 4, wherein
the first-A active region includes a first-$A_1$ active region and a first-$A_2$ active region surrounding the first-$A_1$ active region,
the first-$A_2$ active region, the first-B active region, and the first active region extension portion each have a characteristic as the first conductivity type,
the second active region has a characteristic as the second conductivity type different from the first conductivity type, and
the first-$A_1$ active region has an impurity concentration lower than an impurity concentration of the first-$A_2$ active region.

7. The tunnel field-effect transistor according to claim 1, wherein a voltage different from a voltage applied to the second active region is applied to the semiconductor layer.

8. The tunnel field-effect transistor according to claim 1, wherein the first active region and the first active region extension portion each include a two-dimensional material or graphene.

9. The tunnel field-effect transistor according to claim 1, wherein the second active region and the second active region extension portion each include a silicon semiconductor substrate, a germanium substrate, or a silicon-germanium substrate.

10. The tunnel field-effect transistor according to claim 1, wherein the second active region and the second active region extension portion each include a two-dimensional material or graphene.

11. The tunnel field-effect transistor according to claim 1, wherein an extending direction of the first active region and a length direction of the control electrode are parallel.

12. The tunnel field-effect transistor according to claim 1, wherein an insulation layer is formed between the control electrode and the first active region.

13. The tunnel field-effect transistor according to claim 1, wherein a second insulation layer is provided between the first active region and the second active region.

14. The tunnel field-effect transistor according to claim 1, wherein electrons are moved between the first active region and the second active region due to a tunnel effect by applying voltage to each of the control electrode, the first active region extension portion, and the second active region extension portion, and a conduction state can be achieved by such movement of the electrons.

15. A tunnel field-effect transistor comprising:
a first active region;
a second active region provided under the first active region;
a control electrode provided on the first active region;
a first active region extension portion extending from the first active region; and
a second active region extension portion extending from the second active region,
wherein the first active region includes a first-A active region and a first-B active region located at least between the first-A active region and the first active region extension portion,
an orthographic projection image of the control electrode and an orthographic projection image of the first active region at least partly overlap with each other,
the second active region exists below the first-A active region,
the second active region does not exist below the first-B active region, $L_{1-Y} < L_{2-Total}$ is satisfied in a case where:
a total extension length of an end portion of a portion of the second active region where an orthographic projection image of the second active region overlaps with the orthographic projection image of the first active region is defined as $L_{2-Total}$; and
a length in a Y direction of the first active region overlapping with the orthographic projection image of the second active region is defined as $L_{1-Y}$ when a direction extending from the first active region to the first active region extension portion is defined as an X direction and a stacked direction of the second active region, the first active region, and the control electrode is defined as a Z direction,
the second active region includes a plurality of protruding second active region segments, and
a recess between a first protruding second active region segment and a second protruding second active region segment is embedded with an insulation material,
a portion of the first active region facing the recess has a characteristic as a first conductivity type,
the second active region has a characteristic as a second conductivity type different from the first conductivity type, and
a portion of the first active region facing a protruding second active region segment of the plurality of second active region segments includes a first region having the characteristic as the first conductivity type, and a second region surrounded by the first region and having an impurity concentration lower than an impurity concentration of the first region.

16. The tunnel field-effect transistor according to claim 15, wherein a planar shape of each of the plurality of protruding second active region segments has a strip shape.

17. The tunnel field-effect transistor according to claim 15, wherein the plurality of protruding second active region segments is arrayed in a two-dimensional matrix shape.

18. The tunnel field-effect transistor according to claim 15, wherein the first active region and the first active region extension portion each include a two-dimensional material or graphene.

19. The tunnel field-effect transistor according to claim 15, wherein the second active region and the second active region extension portion each include a silicon semiconductor substrate, a germanium substrate, or a silicon-germanium substrate.

20. A tunnel field-effect transistor comprising:
a first active region;
a second active region provided under the first active region;
a control electrode provided on the first active region;
a first active region extension portion extending from the first active region; and
a second active region extension portion extending from the second active region,
wherein when a portion of the first active region where an orthographic projection image of the control electrode, an orthographic projection image of the first active region, and an orthographic projection image of the second active region overlap with one another is defined as a first-a active region, and a portion of the first active region where the orthographic projection image of the control electrode and the orthographic projection image of the first active region overlap with each other and do not overlap with the orthographic projection image of the second active region is defined as a first-b active region,
the first-b active region has a characteristic as a first conductivity type and the second active region has a characteristic as a second conductivity type different from the first conductivity type,
an insulation region is formed under the first-b active region and under the first active region extension portion, and
the first-a active region includes a first-$a_1$ active region and a first-$a_2$ active region interposed between the first-$a_1$ active region and the first-b active region, having the characteristic as the first conductivity type, and having an impurity concentration higher than an impurity concentration of the first-$a_1$ active region.

* * * * *